US009309446B2

(12) United States Patent
Mitsukura et al.

(10) Patent No.: US 9,309,446 B2
(45) Date of Patent: Apr. 12, 2016

(54) PHOTOSENSITIVE ADHESIVE COMPOSITION, FILM-LIKE ADHESIVE, ADHESIVE SHEET, ADHESIVE PATTERN, SEMICONDUCTOR WAFER WITH ADHESIVE LAYER, SEMICONDUCTOR DEVICE

(75) Inventors: Kazuyuki Mitsukura, Tsukuba (JP); Takashi Kawamori, Tsukuba (JP); Takashi Masuko, Tsukuba (JP); Shigeki Katogi, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 766 days.

(21) Appl. No.: 13/410,702

(22) Filed: Mar. 2, 2012

(65) Prior Publication Data
US 2012/0248632 A1    Oct. 4, 2012

(30) Foreign Application Priority Data

Oct. 30, 2009  (JP) .............................. P2009-250667
Oct. 29, 2010  (JP) .............................. P2010-244033

(51) Int. Cl.
| | |
|---|---|
| G03F 7/00 | (2006.01) |
| G03F 7/004 | (2006.01) |
| C09J 7/02 | (2006.01) |
| H01L 23/00 | (2006.01) |
| G03F 7/027 | (2006.01) |
| G03F 7/037 | (2006.01) |
| G03F 7/038 | (2006.01) |
| C08G 73/10 | (2006.01) |
| C09J 179/08 | (2006.01) |
| H01L 21/683 | (2006.01) |
| H01L 25/065 | (2006.01) |
| H01L 23/29 | (2006.01) |
| H01L 23/31 | (2006.01) |

(52) U.S. Cl.
CPC ............. *C09J 7/0203* (2013.01); *C08G 73/105* (2013.01); *C09J 179/08* (2013.01); *G03F 7/027* (2013.01); *G03F 7/037* (2013.01); *G03F 7/038* (2013.01); *H01L 21/6836* (2013.01); *H01L 24/27* (2013.01); *H01L 24/29* (2013.01); *H01L 25/0657* (2013.01); *C09J 2203/326* (2013.01); *C09J 2205/31* (2013.01); *C09J 2433/00* (2013.01); *C09J 2463/00* (2013.01); *C09J 2479/08* (2013.01); *H01L 23/293* (2013.01); *H01L 23/3128* (2013.01); *H01L 24/32* (2013.01); *H01L 24/48* (2013.01); *H01L 24/73* (2013.01); *H01L 24/92* (2013.01); *H01L 2221/68327* (2013.01); *H01L 2221/68377* (2013.01); *H01L 2224/27002* (2013.01); *H01L 2224/27416* (2013.01); *H01L 2224/27436* (2013.01); *H01L 2224/27622* (2013.01); *H01L 2224/32145* (2013.01); *H01L 2224/32225* (2013.01); *H01L 2224/48227* (2013.01); *H01L 2224/73265* (2013.01); *H01L 2224/92247* (2013.01); *H01L 2225/0651* (2013.01); *H01L 2225/06568* (2013.01); *H01L 2924/0102* (2013.01); *H01L 2924/014* (2013.01); *H01L 2924/0104* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01019* (2013.01); *H01L 2924/01023* (2013.01); *H01L 2924/01029* (2013.01); *H01L 2924/01033* (2013.01); *H01L 2924/01044* (2013.01); *H01L 2924/01047* (2013.01); *H01L 2924/01051* (2013.01); *H01L 2924/01073* (2013.01); *H01L 2924/01077* (2013.01); *H01L 2924/01078* (2013.01); *H01L 2924/01079* (2013.01); *H01L 2924/09701* (2013.01); *H01L 2924/10253* (2013.01); *H01L 2924/12042* (2013.01); *H01L 2924/1461* (2013.01); *H01L 2924/15788* (2013.01); *Y10T 428/24802* (2015.01); *Y10T 428/2817* (2015.01)

(58) Field of Classification Search
CPC .................................. G03F 7/00; G03F 7/004
USPC ................................. 430/270.1, 280.1, 281.1
See application file for complete search history.

(56) References Cited

U.S. PATENT DOCUMENTS

| | | | | |
|---|---|---|---|---|
| 6,232,032 | B1 * | 5/2001 | Nunomura et al. | 430/191 |
| 2006/0199920 | A1 * | 9/2006 | Okada et al. | 525/426 |
| 2008/0176167 | A1 * | 7/2008 | Kawamori et al. | 430/271.1 |

FOREIGN PATENT DOCUMENTS

| | | |
|---|---|---|
| JP | 11-024257 | 1/1999 |
| JP | 2000-290501 | 10/2000 |
| JP | 2001-329233 | 11/2001 |
| JP | 2005-329532 | 12/2005 |
| JP | 2007-291375 | 11/2007 |

(Continued)

OTHER PUBLICATIONS

H. Tachi, et al., "Photo-Induced Thermal Crosslinking of Epoxy Compounds by the Use of Quaternary Ammonium Salts Having Phenacyl Groups", *Journal of Photopolymer Science and Technology*, vol. 12, No. 2, 1999, pp. 313-314.
Y. Kaneko, et al., "Mechanistic Studies of Photobase Generation from Ammonium Tetraorganyl Borate Salts", *Chemistry of Materials*, vol. 11, No. 1, Jan. 1999, pp. 170-176.
J. F. Cameron, et al., "Photogeneration of Amines from α-Keto Carbamates: Photochemical Studies", *Journal of American Chemistry Society*, vol. 118, No. 51, Dec. 25, 1996, pp. 12925-12937.
T. Nishikubo, et al., "Novel Thermal Curing Reactions of Epoxy Resin and Poly(glycidyl methacrylate) Using Photo-generated Difunctional Thiols", *Polymer Journal* vol. 28, No. 9, 1996, pp. 795-800.

*Primary Examiner* — Kelechi Egwim
(74) *Attorney, Agent, or Firm* — Fitch, Even, Tabin and Flannery LLP

(57) ABSTRACT

The present invention relates to a photosensitive adhesive composition that has thermal press bondability to an adherent after being patterned by exposure and development and enables alkali development, wherein a storage elastic modulus at 110° C. after exposure and further heat curing is not less than 10 MPa.

24 Claims, 27 Drawing Sheets

(56) References Cited

FOREIGN PATENT DOCUMENTS

| | | | |
|---|---|---|---|
| JP | 2008-88403 | | 4/2008 |
| JP | 2008088403 A | * | 4/2008 |
| JP | 2009-164574 | | 7/2009 |
| JP | 2009-221453 | | 10/2009 |
| JP | 2009-227959 | | 10/2009 |
| WO | WO 2007/004569 | | 1/2007 |
| WO | WO 2009/072492 | | 6/2009 |
| WO | WO 2010/024295 | | 3/2010 |

* cited by examiner (a)

(b)

(a)

(b)

(c)

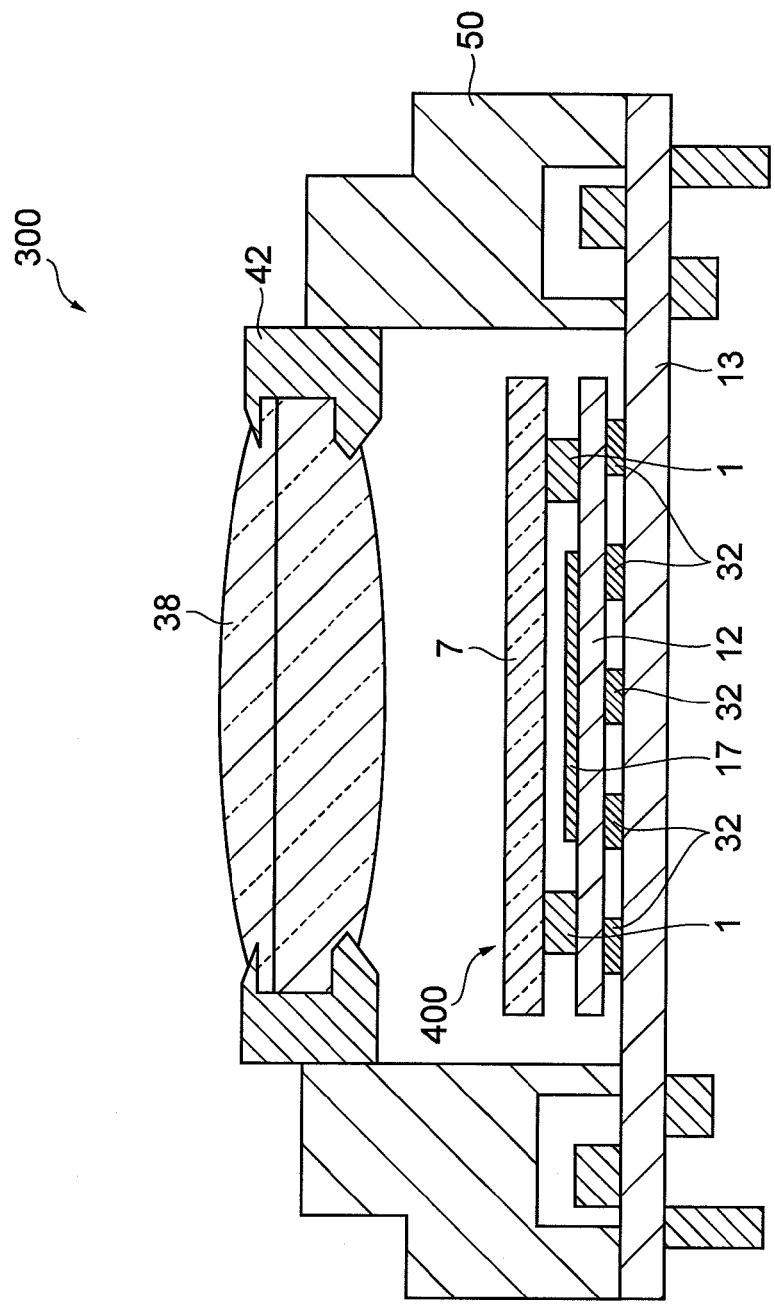

PHOTOSENSITIVE ADHESIVE COMPOSITION, FILM-LIKE ADHESIVE, ADHESIVE SHEET, ADHESIVE PATTERN, SEMICONDUCTOR WAFER WITH ADHESIVE LAYER, SEMICONDUCTOR DEVICE

BACKGROUND OF THE INVENTION

1. Field of the Invention

The present invention relates to a photosensitive adhesive composition, a film-like adhesive, an adhesive sheet, an adhesive pattern, a semiconductor wafer with an adhesive layer, a transparent substrate with an adhesive layer, and a semiconductor device.

2. Related Background Art

Recently, along with higher performance and function of electronic parts, semiconductor packages having a variety of forms have been proposed. In production of the semiconductor package, an adhesive is used to bond a semiconductor element to a semiconductor element-mounting support member. Usually, properties such as adhesion properties, thermal press bondability, heat resistance, and moisture resistance are demanded of the adhesive; in the case where the adhesive is used in a film-like form, application properties are further needed.

Depending on the function and form of the semiconductor package, and a technique for simplification of a fabrication process of the semiconductor package, an adhesive having photosensitivity enabling pattern formation in addition to the properties above may be needed. The photosensitivity means a function in which a portion irradiated with light chemically changes to be insoluble or soluble in an aqueous solution or an organic solvent. If the photosensitive adhesive having the photosensitivity is used, by performing exposure and developing treatments through a photomask, it is possible to form a highly fine adhesive pattern, and the formed adhesive pattern has the thermal press bondability to an adherent.

As a photosensitive adhesive composition, photoresists, polyimide resin precursor (polyamic acid)-based compositions (for example, Japanese Patent Application Laid-Open Publication Nos. 2000-290501, 2001-329233, and 11-24257), and low Tg polyimide resin-based compositions are known in the related art (for example, WO 07/004569). Moreover, from the viewpoint of a working environment, an effluent treatment and the like, photosensitive adhesive compositions enabling pattern formation by an alkali developer are prevailing.

SUMMARY OF THE INVENTION

A solid-state imaging element mounted on a CMOS sensor or the like has a structure, for example, as shown in FIG. 26, in which a glass substrate 7 and a semiconductor chip 12 are bonded by a patterned adhesive layer 1. The adhesive pattern at this time is formed so as to surround an effective pixel region 17 of the semiconductor chip 12, and also serves as a sealing material so that the effective pixel region 17 is not influenced from the outside.

However, when the solid-state imaging element is produced using the conventional photosensitive adhesive composition, the following problem may occur. Namely, when fabricating or using the CMOS sensor or the like, the solid-state imaging element may be exposed to an environment under a high temperature and high humidity; thereby dew condensation may occur within the portion surrounded by the frame-like adhesive. If there is such dew condensation, the solid-state imaging element cannot produce accurate photoconversion, and the dew condensation becomes a factor causing problems with image recognition and display. The conventional photosensitive adhesive composition is not sufficiently considered in airtight sealing properties; particularly when forming a highly fine adhesive pattern, an adhesion area is extremely small; for this, the above problem is likely to occur.

The present invention has been made in consideration of such circumstances, and an object of the present invention is to provide a photosensitive adhesive composition, a film-like adhesive, an adhesive sheet, an adhesive pattern, a semiconductor wafer with an adhesive layer, a transparent substrate with an adhesive layer, and a semiconductor device in which sufficient airtight sealing properties can be obtained even in the case of patterning.

One aspect of the present invention provides a photosensitive adhesive composition that has thermal press bondability to an adherent after being patterned by exposure and development and enables alkali development, wherein a storage elastic modulus at 110° C. after exposure and further heat curing is not less than 10 MPa.

The phrase "having thermal press bondability to an adherent" means that one produces a sample by thermally press-bonding an adherent to the adhesive layer after being patterned at 150° C. to 180° C. and 0.2 MPa to 1.0 MPa for 1 minute, and the die shear strength at room temperature of the sample is not less than 1 MPa. Here, the die shear strength at room temperature is defined as the largest stress when using a Shear Bond tester (made by Dage Holdings Limited, trade name: Dage-4000), with respect to the sample after thermal press-bonding under the conditions above, one applies an external force in a shear direction to the adherent on a heating plate at 25° C. under the conditions of a measurement rate: 100 μm/sec and a measurement height: 50 μm.

The "storage elastic modulus at 110° C. after exposure and further heat curing" means the storage elastic modulus measured according to the following procedure. First, one forms a laminate film in which a film-like adhesive (adhesive layer) composed of a photosensitive adhesive composition of 40 μm in thickness is laminated between two polyethylene terephthalate (PET) films subjected to a releasing treatment; one exposes the laminate film entirely by a high precision parallel exposure machine (made by ORC MANUFACTURING CO., LTD., trade name: EXM-1172-B-∞) at 1000 mJ/cm²; next, one heats the laminate film on a hot plate at 80° C. for approximately 30 seconds. Subsequently, using a conveyor developing machine (made by YAKO Co., Ltd.), onto the film-like adhesive with the PET film obtained by removing one of the PET films, one sprays a developer, i.e., a 2.38% by mass solution of tetramethylammonium hydride (TMAH) under the conditions of a temperature of 26° C. and a spray pressure of 0.18 MPa for 1 minute, with the film-like adhesive side facing upward, and sprays pure water at a temperature of 25° C. under the conditions of a spray pressure of 0.02 MPa for 6 minutes to wash with water. One prepares two film-like adhesives with the PET film subjected to such a developing treatment, heats and dries them by a hot plate at 120° C. for 10 minutes, and then laminates the adhesives such that they are applied to each other by roll pressure (a temperature of 100° C., a line pressure of 4 kgf/cm, a feeding rate of 0.5 m/min), to obtain a laminate of 80 μm in thickness. Next, one removes one of the PET films from the laminate, and applies roll pressure to the exposed adhesive to bond the adhesive to a Teflon (R) sheet; then, removes also the other PET film. One heats the thus-obtained laminate in an oven under the conditions of 180° C. for 3 hours. One removes the heat-cured film-like adhesive from the Teflon (R) sheet and cuts into a 30 mm strip with a width of 5 mm to use it as a sample; using a viscoelasticity analyzer (made by Rheometric Scientific Inc., trade name: RSA-2), one performs measurement under the conditions of a temperature raising rate of 5° C./min, a frequency of 1 Hz, and a measurement temperature of −50° C. to 300° C. to determine the storage elastic modulus at 110° C.

According to the photosensitive adhesive composition according to one aspect of the present invention, the photosensitive adhesive composition has the above configuration; thereby, even if the photosensitive adhesive composition is patterned in a shape of a frame and the adherents are bonded to each other, the airtightness of a hollow portion surrounded by the cured resin can be sufficient. The present inventors think that the reason why the photosensitive adhesive composition of the present invention is excellent in airtight sealing properties is because in a cured product having the specific storage elastic modulus, molecular motion in a crosslinked product is sufficiently suppressed even under a high temperature, and moisture permeability under a high temperature and high humidity is sufficiently reduced.

In the photosensitive adhesive composition according to one aspect of the present invention, the storage elastic modulus at 110° C. of the film-like adhesive (adhesive layer) after exposure and further heat curing may be not less than 10 MPa, or not less than 20 MPa.

From the viewpoint of further improving the airtight sealing properties, in the photosensitive adhesive composition according to one aspect of the present invention, Tg after exposure and further heat curing may be not less than 80° C., or not less than 100° C.

The Tg is a tan δ peak temperature when one prepares a sample in the same manner as in the case of measuring the "storage elastic modulus at 110° C. after exposure and further heat curing," and measures the sample on the same condition as that in the measurement of the storage elastic modulus.

By setting a Tg of the photosensitive adhesive composition to not less than 80° C., even if the photosensitive adhesive composition is patterned in a shape of a frame and the adherents are bonded to each other, one can keep the airtightness of the hollow portion surrounded by the cured resin more securely.

From the viewpoint of the thermal press bondability, the high temperature adhesion properties, the moisture resistance reliability, and the airtight sealing properties, in the photosensitive adhesive composition according to one aspect of the present invention, the lowest melt viscosity at 20° C. to 200° C. after exposure may be not more than 30000 Pa·s, or may be not more than 20000 Pa·s.

The "lowest melt viscosity" refers to the lowest value of the melt viscosity at 20° C. to 200° C. obtained by measuring a film using a viscoelasticity measurement apparatus (made by Rheometric Scientific Inc., trade name: ARES), the film being prepared by performing exposure, development, washing with water, and heating and drying at 120° C. for 10 minutes in the same manner as in the case of measuring the "storage elastic modulus at 110° C. after exposure and further heat curing." As a measurement plate, one uses a parallel plate of 8 mm in diameter; the measurement condition is of a temperature raising rate of 5° C./min, a measurement temperature of −50° C. to 300° C., and a frequency of 1 Hz.

By setting a lowest melt viscosity of the photosensitive adhesive composition to not more than 30000 Pa·s, even if the photosensitive adhesive composition is patterned in a shape of a frame and the adherents are bonded to each other, one can keep the airtightness of the hollow portion surrounded by the cured resin more securely. The present inventors think the reason as follows: according to the photosensitive adhesive composition having the lowest melt viscosity, sufficient bonding is enabled in the case where one thermally press-bonds the adherent, and thereby it is possible to reduce invading of moisture or the like from a bonding interface.

The photosensitive adhesive composition according to one aspect of the present invention may include an (A) alkali-soluble resin, a (B) radiation polymerizable compound, and a (C) photoinitiator.

From the viewpoint of further improving the airtight sealing properties, the Tg of the (A) alkali-soluble resin may be 40° C. to 150° C., may be 50° C. to 120° C., or may be 60° C. to 100° C. By setting a Tg of the (A) alkali-soluble resin in the range above, one can secure sufficient thermal press bondability when applying the film-like adhesive obtained by forming the photosensitive adhesive composition into a film-like shape to the adherent, and further improve the airtight sealing properties.

From the viewpoint of the high temperature adhesion properties and the pattern forming properties, the (A) alkali-soluble resin may be a polyimide resin having a carboxyl group and/or a hydroxyl group. From the viewpoint of improving the airtight sealing properties to reduce production of dew condensation, the (A) alkali-soluble resin may be a polyimide resin having a hydroxyl group.

From the viewpoint of the thermal press bondability, the temperature adhesion properties, the pattern forming properties, and the airtight sealing properties, the (A) alkali-soluble resin may be a polyimide resin obtained by reacting tetracarboxylic dianhydride with a diamine, the diamine including 10 mol % to 80 mol % of a carboxyl group-including diamine and/or a phenolic hydroxyl group-including diamine based on diamines in total.

From the viewpoint of the thermal press bondability, the temperature adhesion properties, the pattern forming properties, and the airtight sealing properties, the diamine may include 10 mol % to 80 mol % of an aliphatic ether diamine represented by formula (8) based on the diamines in total. In the formula, $R^1$ to $R^3$ each independently represent an alkylene group having 1 to 10 carbon atoms, and b represents an integer of 2 to 80.

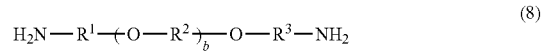

(8)

From the viewpoint of the thermal press bondability, the temperature adhesion properties, the pattern forming properties, and the airtight sealing properties, the diamine may include 10 mol % to 80 mol % of a phenolic hydroxyl group-including diamine represented by formula (A-1) based on the diamines in total. In the formula, $R^{21}$ represents a single bond or a divalent organic group.

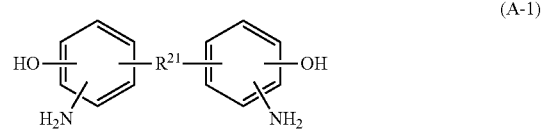

(A-1)

From the viewpoint of the high temperature adhesion properties and the airtight sealing properties, the (B) radiation polymerizable compound may include at least one (meth) acrylate having a functionality of 3 or more. Thereby, it is possible to increase the storage elastic modulus after exposure and further heat curing, and as a result, it is possible to improve the airtight sealing properties.

From the viewpoint of the thermal press bondability, the high temperature adhesion properties, the moisture resistance reliability, and the airtight sealing properties, the photosensitive adhesive composition including the (A) component, the (B) component, and the (C) component may further include a (D) epoxy resin; from the viewpoint of the thermal press bondability, the high temperature adhesion properties, the moisture resistance reliability, and the airtight sealing properties, the photosensitive adhesive composition including the (A) component, the (B) component, and the (C) component may further include an (E) compound having an ethylenically unsaturated group and an epoxy group. Particularly, if the photosensitive adhesive composition contains the (E) compound having an ethylenically unsaturated group and an epoxy group, it is possible to improve the thermal press bondability, and as a result, it is possible to improve the airtight sealing properties.

From the viewpoint of the high temperature adhesion properties, the pattern forming properties, the moisture resistance reliability, and the airtight sealing properties, the (D) epoxy resin may include at least one of a bisphenol F epoxy resin and a bisphenol A epoxy resin.

From the viewpoint of the film forming properties, the high temperature adhesion properties, and the airtight sealing properties, the photosensitive adhesive composition according to one aspect of the present invention may further include an (F) filler.

Another aspect of the present invention provides a film-like adhesive obtained by molding the photosensitive adhesive composition according to the one aspect of the present invention into a film-like shape.

Another aspect of the present invention provides an adhesive sheet comprising a base material, and an adhesive layer formed on the base material and composed of the film-like adhesive according to the one aspect of the present invention.

Another aspect of the present invention provides an adhesive pattern obtained by exposing an adhesive layer laminated on an adherent and composed of the film-like adhesive according to the one aspect of the present invention, and performing a developing treatment on the adhesive layer after exposure with an alkali developer.

Another aspect of the present invention provides a semiconductor wafer with an adhesive layer comprising a semiconductor wafer, and an adhesive layer laminated on the semiconductor wafer and composed of the film-like adhesive according to the one aspect of the present invention.

Another aspect of the present invention provides a transparent substrate with an adhesive layer comprising a transparent substrate, and an adhesive layer laminated on the transparent substrate and composed of the film-like adhesive according to the one aspect of the present invention.

Another aspect of the present invention provides a semiconductor device having a structure in which using the photosensitive adhesive composition according to the one aspect of the present invention, semiconductor elements are bonded to each other, and/or a structure in which using the photosensitive adhesive composition according to one aspect of the present invention, a semiconductor element and a semiconductor element-mounting support member are bonded to each other. In the case where the semiconductor device according to one aspect of the present invention has the latter structure, the semiconductor element-mounting support member may be a transparent substrate.

According to the present invention, it is possible to provide a photosensitive adhesive composition, a film-like adhesive, an adhesive sheet, an adhesive pattern, a semiconductor wafer with an adhesive layer, a transparent substrate with an adhesive layer, and a semiconductor device in which sufficient airtight sealing properties can be obtained even in the case of patterning.

BRIEF DESCRIPTION OF THE DRAWINGS

FIG. 27 is an end surface view showing an example of a CMOS sensor using a semiconductor element shown in FIG. 26 as a solid-state imaging element.

DESCRIPTION OF THE PREFERRED EMBODIMENTS

Figure 1:
FIG. 1 is an end surface view showing one embodiment of a film-like adhesive.

Hereinafter, when necessary, with reference to the drawings, embodiments for implementing the present invention will be described in detail. However, the present invention will not be limited to the embodiments below. In the drawings, same reference numerals will be given to same elements, and duplicating description will be omitted. Moreover, positional relations such as top, bottom, left, and right are based on positional relations shown in the drawings unless otherwise specified, and dimensional ratios in the drawings will be limited to ratios shown.

In the Description, the "application properties" of the photosensitive adhesive composition mean application properties in the case of a film-like adhesive obtained by molding a photosensitive adhesive composition into a film-like shape. The "high temperature adhesion properties" of the photosensitive adhesive composition mean adhesion properties under heating in the case where one forms the photosensitive adhesive composition into a cured product. The "pattern forming properties" of the photosensitive adhesive composition mean precision of an adhesive pattern obtained when exposing an adhesive layer formed on an adherent and composed of the film-like adhesive through a photomask and developing with an alkali developer. The "thermal press bondability" of the photosensitive adhesive composition means a bonding state when press-bonding (thermally press-bonding) the adhesive pattern under heating to a support member or the like. The "heat resistance" of the photosensitive adhesive composition means peel resistance when thermally press-bonding the adhesive pattern to a support member or the like, curing, and placing under a high temperature. The "airtight sealing properties" of the photosensitive adhesive composition mean dew condensation resistance (antifogging properties) or peel resistance after thermally press-bonding a frame-like pattern of the photosensitive adhesive to a support member or the like, curing, and treating under a high temperature and high humidity. "Reflow resistance" means peel resistance after thermally press-bonding the frame-like pattern of the photosensitive adhesive to a support member or the like, curing, leaving as it is under a high temperature and high humidity condition for a predetermined time, and performing reflow heating.

The photosensitive adhesive composition of the present embodiment is a photosensitive adhesive composition that has the thermal press bondability to an adherent after the photosensitive adhesive composition is patterned by exposure and development and enables alkali development, wherein the storage elastic modulus at 110° C. after exposure and further heat curing is not less than 10 MPa.

It is preferable that the photosensitive adhesive composition of the present embodiment contain an (A) alkali-soluble resin (hereinafter, simply referred to as the (A) component in some cases.), a (B) radiation polymerizable compound (hereinafter, simply referred to as the (B) component in some cases.), and a (C) photoinitiator (hereinafter, simply referred to as the (C) component in some cases.).

It is preferable that a Tg of the (A) component is not more than 150° C., it is more preferable that the Tg is not more than 120° C., and it is most preferable that the Tg is not more than 100° C. In the case where a Tg exceeds 150° C., it requires a high temperature when one applies the film-like adhesive obtained by forming the photosensitive adhesive composition into a film-like shape to an adherent, and warpage tends to occur in a semiconductor wafer. Moreover, the melt viscosity of the adhesive after pattern formation tends to be increased, and the thermal press bondability tends to be reduced.

It is preferable that temperature in application of the film-like adhesive to a rear surface of a wafer is 20° C. to 150° C., and it is more preferable that the temperature is 40° C. to 100° C. At a temperature in the range, warpage of the semiconductor wafer tends to be suppressed. In order to enable application at the temperature, it is preferable that the Tg of the film-like adhesive is not more than 150° C. Moreover, it is preferable that a lower limit of the Tg is not less than 40° C., it is more preferable that the lower limit is not less than 60° C., and it is most preferable that the lower limit is not less than 70° C. In the case where the Tg is less than 40° C., it is necessary to blend a large amount of other curable component in order to improve the elastic modulus after exposure and heat curing, and the handling properties, a storage stability, the pattern forming properties, the thermal press bondability, the heat resistance, and low stress properties tend to be reduced.

Here, the "Tg" of the (A) component is a tan δ peak temperature when using a viscoelasticity analyzer (made by Rheometric Scientific Inc., trade name: RSA-2), one measures a film formed with the (A) component under the conditions of a temperature raising rate of 5° C./min, a frequency of 1 Hz, and a measurement temperature of −150° C. to 300° C.

It is preferable that the weight average molecular weight of the (A) component is controlled within the range of 5000 to 500000, it is more preferable that the weight average molecular weight of the (A) component is controlled within the range of 10000 to 300000, and it is most preferable that the weight average molecular weight of the (A) component is controlled within the range of 10000 to 100000. If a weight average molecular weight is within the range, strength, flexibility, and tacking properties when one forms the photosensitive adhesive composition into a sheet- or film-like shape become good. Moreover, because fluidity during heating becomes good, it is possible to secure good embedding properties to a difference between wirings on the surface of the substrate (depressions and projections). When the weight average molecular weight is less than 5000, the film forming properties tend to be not sufficient. On the other hand, when the weight average molecular weight exceeds 500000, the fluidity during heating and the embedding properties tend to be not sufficient, and solubility of the photosensitive adhesive composition in an alkali developer when pattern forming is not sufficient. Here, the "weight average molecular weight" means a weight average molecular weight when measuring in terms of polystyrene using a high performance liquid chromatograph (made by SHIMADZU Corporation, trade name: C-R4A).

By setting the Tg and weight average molecular weight of the (A) component within the ranges, it is possible to reduce the temperature in application to the wafer. Further, it is also possible to reduce the heating temperature (thermal press-bonding temperature) when bonding and fixing the semiconductor element to the semiconductor element-mounting support member; and while suppressing an increase in warpage of the semiconductor element, it is possible to give the high temperature adhesion properties and the airtight sealing properties. Moreover, it is possible to give the application properties, the thermal press bondability, and developing properties effectively.

In the photosensitive adhesive composition of the present embodiment, as the (A) component, a polymer having an alkali-soluble group is preferable, and a polymer having an alkali-soluble group in the terminal or the side chain is more preferable. Examples of the alkali-soluble group include an ethylene glycol group, a carboxyl group, a hydroxyl group, a sulfonyl group, and a phenolic hydroxyl group. The polymer having an alkali-soluble group may be those having one of the functional groups alone, or those having two or more thereof.

Examples of the (A) component include polyester resins, polyether resins, polyimide resins, polyamide resins, polyamide imide resins, polyetherimide resins, polyurethane resins, polyurethane imide resins, polyurethane amide imide resins, siloxane polyimide resins, and polyesterimide resins, as well as copolymers thereof, precursors thereof (such as polyamic acid), polybenzoxazole resins, phenoxy resins, polysulfone resins, polyethersulfone resins, polyphenylene sulfide resins, polyester resins, polyether resins, polycarbonate resins, polyether ketone resins, (meth)acrylic copolymers of 10000 to 1000000 in weight average molecular weight, novolak resins, and phenol resins. It is possible to use one of these alone, or two or more thereof in combination. A glycol group such as an ethylene glycol and a propylene glycol, a carboxyl group and/or a hydroxyl group may be given to the main chain and/or the side chain in these resins.

Among these, it is preferable from the viewpoint of the high temperature adhesion properties, the heat resistance, and the film forming properties that the (A) component be polyimide resins. The polyimide resin can be obtained, for example, by condensation reacting tetracarboxylic dianhydride with diamine by a known method.

As the mixing molar ratio of diamine to tetracarboxylic dianhydride in the condensation reaction, it is preferable that the total of diamine is 0.5 mol to 2.0 mol based on 1.0 mol of the total of tetracarboxylic dianhydride, and it is more preferable that the total of diamine is 0.8 mol to 1.0 mol based on 1.0 mol of the total of tetracarboxylic dianhydride. The order to add tetracarboxylic anhydride and diamine may be any order.

In the condensation reaction, if the total of diamine exceeds 2.0 mol based on 1.0 mol of the total of tetracarboxylic dianhydride, the amount of a polyimide oligomer having an amine terminal tends to be increased in the polyimide resin to be obtained. On the other hand, when the total of diamine is less than 0.5 mol, the amount of a polyimide resin oligomer having an acid terminal tends to be increased. By setting the mixing molar ratio of diamine to tetracarboxylic dianhydride within the range, the weight average molecular weight of the polyimide resin is increased, and various properties such as heat resistance of the resin composition are given.

It is preferable that the reaction temperature in the condensation reaction is not more than 80° C., and it is more preferable that the reaction temperature is 0° C. to 60° C. As the reaction progresses, the viscosity of the reaction solution is gradually increased to produce polyamic acid that is a precursor of the polyimide resin. In order to suppress reduction in the properties of the resin composition, it is preferable that the tetracarboxylic dianhydride be subjected to a refinement treatment by recrystallization using acetic anhydride.

The polyimide resin in the present embodiment means a resin having an imide group. Specifically, examples of the polyimide resin having an imide group include polyimide resins, polyamide imide resins, polyurethaneimide resins, polyetherimide resins, polyurethaneamideimide resins, siloxane polyimide resins, and polyesterimide resins, and are not particularly limited to these.

The polyimide resin can be obtained by dehydrating and ring closing the condensation reaction product (polyamic acid). It is possible to perform the dehydration and ring closure by a heat ring closure method performing a heat treatment, a chemical ring closure method using a dehydrating agent, and the like.

The tetracarboxylic dianhydride used as a raw material for the polyimide resin is not particularly limited, and examples thereof include: pyromellitic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4-bis(3,4-dicarboxyphenoxy)diphenylsulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, and tetracarboxylic dianhydrides represented by formula (1). In formula (1), a represents an integer of 2 to 20.

(1)

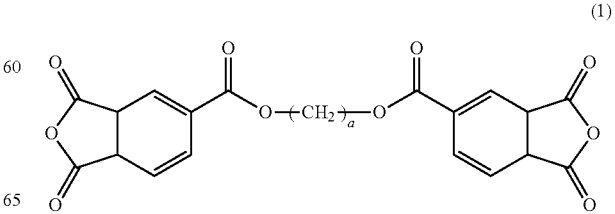

The tetracarboxylic dianhydrides represented by formula (1) can be synthesized from trimellitic anhydride monochloride and the corresponding diol, for example; specifically, examples thereof include 1,2-(ethylene)bis(trimellitate anhydride), 1,3 (trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride).

As thetetracarboxylic dianhydride, preferred is tetracarboxylic dianhydride represented by formula (2) or (3) from the viewpoint of giving good solubility in a solvent, moisture resistance, and transparency to the light whose wavelength is 365 nm.

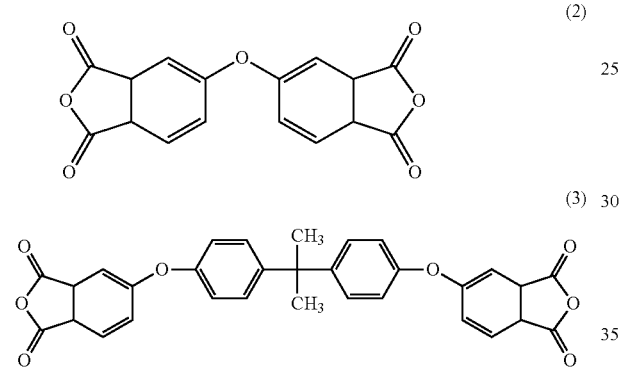

It is possible to use one of the tetracarboxylic dianhydrides as above alone, or two or more thereof in combination.

It is further preferable that the (A) component is a carboxyl group and/or hydroxyl group-including polyimide resin. From the viewpoint of further improving the airtight sealing properties to reduce production of dew condensation while keeping the better pattern forming properties, it is more preferable that the (A) component is a hydroxyl group-including polyimide resin. It is preferable that the diamine used as the raw material for the polyimide resin contain aromatic diamines represented by formulas (4) to (7) and formula (7'). It is preferable that the diamines represented by formulas (4) to (7) and formula (7') are 5 mol % to 100 mol % of all the diamines, it is more preferable that the diamines represented by formulas (4) to (7) and formula (7') are 10 mol % to 90 mol % of all the diamines, it is still more preferable that the diamines represented by formulas (4) to (7) and formula (7') are 10 mol % to 80 mol % of all the diamines, it is particularly preferable that the diamines represented by formulas (4) to (7) and formula (7') are 20 mol % to 80 mol % of all the diamines, and it is most preferable that the diamines represented by formulas (4) to (7) and formula (7') are 30 mol % to 70 mol % of all the diamines. By setting an amount of the diamines to be blended above, it is possible to control the Tg of polyimide in the range above while keeping alkali-solubility, and thereby to provide the application properties, the thermal press bondability, the high temperature adhesion properties, the reflow resistance, and the airtight sealing properties.

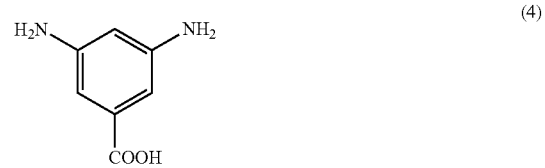

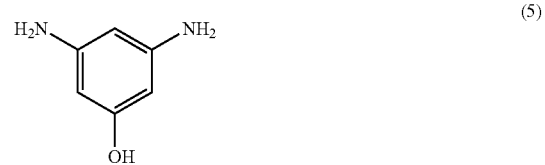

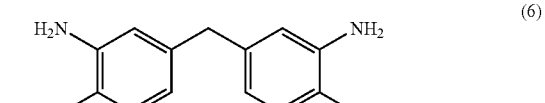

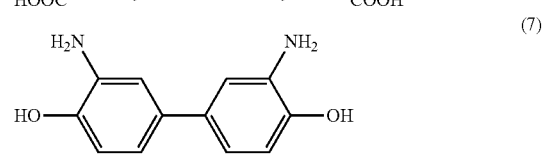

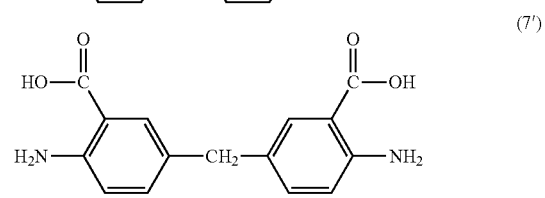

From the viewpoint of obtaining good pattern forming properties and thermal press bondability when the polyimide resin whose Tg is high is used, as the diamine, diamines having a phenolic hydroxyl group are preferable, and diamines represented by formula (A-1) are more preferable. It is preferable that the diamines represented by formula (A-1) are 10 mol % to 80 mol % of all the diamines, and it is more preferable that the diamines represented by formula (A-1) are 20 mol % to 80 mol % of all the diamines, and it is still more preferable that the diamines represented by formula (A-1) are 30 mol % to 70 mol % of all the diamines. If one uses a carboxyl group—including resin as the polyimide resin, there is a tendency that, by reacting with the epoxy resin blended during heating and drying, the acid value of the thermoplastic resin is significantly reduced. Contrary to this, if the side chain of the polyimide resin is a phenolic hydroxyl group, it is more difficult to progress the reaction with the epoxy resin than in the case of the carboxyl group. As a result, it is thought that the pattern forming properties, the thermal press bondability, and the high temperature adhesion properties are improved. In the formula, $R^{21}$ represents a single bond or a divalent organic group.

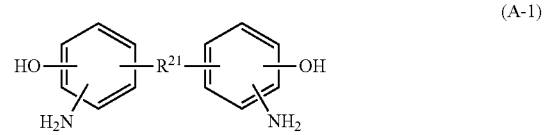

Examples of the divalent organic group include a divalent hydrocarbon group having 1 to 30 carbon atoms, a divalent hydrocarbon group having 1 to 30 carbon atoms in which hydrogen atoms are partially or entirely replaced by a halogen atom, —(C═O)—, —SO$_2$—, —O—, —S—, —(C═O)—O—, a group represented by formula (B-1), and a group represented by formula (B-2). In the formulas, n represents an integer of 1 to 20, and R represents a hydrogen atom or a methyl group.

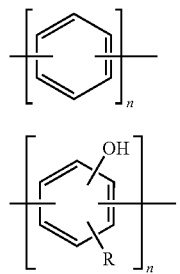

From the viewpoint of the pattern forming properties when the Tg of polyimide is raised, it is preferable that $R^{21}$ be —C(CF$_3$)$_2$— and —C(CH$_3$)$_2$—. By using the diamine having such a group, it is possible to suppress aggregation of imide groups in polyimide during the pattern formation, and the alkali developer easily penetrates, thereby enabling improving the pattern forming properties. Thereby, it is possible to obtain good pattern forming properties even if the Tg of polyimide is raised, and realization of the photosensitive adhesive composition whose airtight sealing properties are further improved is enabled.

In the present embodiment, it is preferable that the diamine having the phenolic hydroxyl group contain a diphenol diamine represented by the following formula and having a fluoroalkyl group. By a fluoroalkyl group being introduced into the polyimide chain, the molecular chain aggregation force between polyimides is reduced, and the developer easily penetrates. As a result, the pattern forming properties (dissolving and developing properties, thinner line) of the photosensitive adhesive composition are further improved. By reduction in the aggregation force of polyimide, it is possible to improve the thermal press bondability and further to obtain the good pattern forming properties even if the Tg of polyimide is raised. Thereby, realization of the photosensitive adhesive composition whose airtight sealing properties and reflow resistance are further improved is enabled.

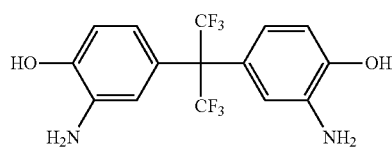

It is preferable that the diphenol diamine having a fluoroalkyl group is 5 mol % to 100 mol % of all the diamines, it is more preferable that the diphenol diamine having a fluoroalkyl group is 10 mol % to 90 mol % of all the diamines, it is still more preferable that the diphenol diamine having a fluoroalkyl group is 10 mol % to 80 mol % of all the diamines, it is particularly preferable that the diphenol diamine having a fluoroalkyl group is 20 mol % to 80 mol % of all the diamines, and it is most preferable that the diphenol diamine having a fluoroalkyl group is 30 mol % to 70 mol % of all the diamines.

Other diamine used as a raw material for the polyimide resin is not particularly limited, and examples thereof include: aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenyl sulfone, 3,4'-diaminodiphenyl sulfone, 4,4'-diaminodiphenyl sulfone, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl)sulfide, bis(4-(4-aminophenoxy)phenyl)sulfide, bis(4-(3-aminophenoxy)phenyl) sulfone, bis(4-(4-aminophenoxy)phenyl) sulfone, 3,3'-dihydroxy-4,4'-diaminobiphenyl, and 3,5-diaminobenzoic acid; 1,3-bis(aminomethyl)cyclohexane; 2,2-bis(4-aminophenoxyphenyl)propane; aliphatic ether diamines represented by formula (8); and siloxane diamines represented by formula (9). In formula (8), $R^1$, $R^2$, and $R^3$ each independently represent an alkylene group having 1 to 10 carbon atoms, b represents an integer of 2 to 80. In formula (9), $R^4$ and $R^9$ each independently represent an alkylene group having 1 to 5 carbon atoms or a phenylene group, $R^5$, $R^6$, $R^7$, and $R^8$ each independently represent an alkyl group having 1 to 5 carbon atoms, a phenyl group, or a phenoxy group, and d represents an integer of 1 to 5. The phenylene group may have a substituent.

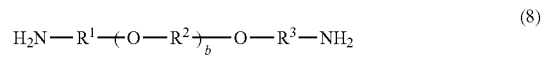

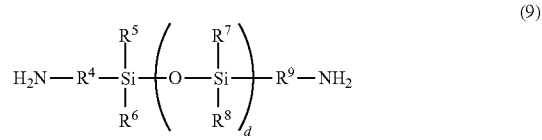

Among the diamines, preferable are the aliphatic ether diamines represented by formula (8), and more preferable are ethylene glycol and/or propylene glycol diamines from the viewpoint of giving compatibility with other component, solubility in an organic solvent, and alkali-solubility.

Specifically, examples of such aliphatic ether diamines include aliphatic diamines such as polyoxyalkylenediamines such as JEFFAMINEs D-230, D-400, D-2000, D-4000, ED-600, ED-900, ED-2000, and EDR-148 made by Huntsman Corporation; Polyetheramines D-230, D-400, and D-2000 made by BASF SE. It is preferable that these diamines are 1 mol % to 80 mol % of all the diamines, it is more preferable that these diamines are 10 mol % to 80 mol % of all the diamines, and it is still more preferable that these diamines are 10 mol % to 60 mol % of all the diamines. When the amount is less than 1 mol %, giving of the high temperature adhesion properties and the fluidity during heating tends to be difficult; on the other hand, when the amount exceeds 80 mol %, the Tg of the polyimide resin is excessively reduced, and self support properties of the film tend to be not sufficient.

Further, from the viewpoint of the pattern forming properties, it is preferable that the aliphatic ether diamine have a propylene ether skeleton represented by the following structural formula, and the molecular weight is 300 to 600. In the case of using such a diamine, from the viewpoint of the self support properties of the film, the high temperature adhesion properties, the reflow resistance, and the airtight sealing properties, it is preferable that the amount is not more than 80 mol % of all the diamines, and it is more preferable that the amount is not more than 60 mol % of all the diamines. Moreover, from the viewpoint of the application properties, the thermal press bondability, and the high temperature adhesion properties, it is preferable that the amount is not less than 10 mol % of all the diamines, and it is more preferable that the amount is not less than 20 mol % of all the diamines. Since the amount is in the range, it is possible to control the Tg of polyimide in the range above, and enabling to give the application properties, the thermal press bondability, the high temperature adhesion properties, reflow resistance, and the airtight sealing properties. In the following structural formula, m represents an integer of 3 to 7.

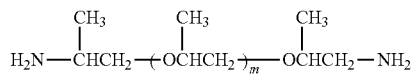

From the viewpoint of improving close adhesion and adhesion properties at room temperature, siloxane diamine represented by formula (9) is preferred.

Specifically, examples of the siloxane diamine represented by formula (9) wherein d is 1 include 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane, and 1,3-dimethyl-1,3-dimethoxy-1,3-bis(4-aminobutyl)disiloxane. Specifically, examples of the siloxane diamine represented by formula (9) wherein d is 2 include 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane, and 1,1,3,3,5,5-hexapropyl-1,5-bis(3-aminopropyl)trisiloxane.

It is possible to use one of the diamines alone, or two or more thereof in combination. It is preferable that the amount of the diamine is 1 mol % to 80 mol % of all the diamines, it is more preferable that the amount is 2 mol % to 50 mol % of all the diamines, and it is most preferable that the amount is 5 mol % to 30 mol % of all the diamines. When the amount is less than 1 mol %, an effect of adding siloxane diamine is reduced; when the amount is more than 80 mol %, the compatibility with other component, the high temperature adhesion properties, and the developing properties tend to be reduced.

It is possible to use one of the polyimide resins alone, or two or more thereof by mixing as required.

When determining the composition of the polyimide resin, it is preferable to design the composition such that the Tg is not more than 150° C. as described above, and it is particularly preferable to use the aliphatic ether diamine represented by formula (8) as the diamine that is a raw material for the polyimide resin.

During synthesis of the polyimide resin, by putting monofunctional acid anhydride and/or monofunctional amine such as a compound represented by formula (10), (11), or (12) into a condensation reaction solution, it is possible to introduce a functional group other than acid anhydride or diamine into the terminal of the polymer. Thereby, it is possible to reduce the molecular weight of the polymer, and improve the developing properties at the time of pattern formation and the thermal press bondability. The functional group other than acid anhydride and diamine is not particularly limited; however, alkali-soluble groups such as a carboxyl group, a phenolic hydroxyl group, and a glycol group are preferred from the viewpoint of improving the alkali-solubility at the time of pattern formation. From the viewpoint of giving the adhesion properties, a compound represented by formula (12) and a compound having a radiation polymerizable group and/or a thermosetting group such as (meth)acrylate having an amino group are preferably used. From the viewpoint of giving low moisture absorbing properties, a compound having a siloxane skeleton or the like is preferably used.

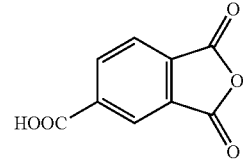

(10)

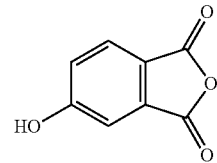

(11)

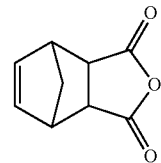

(12)

From the viewpoint of photo-curing properties, in the polyimide resin, it is preferable that the transmittance to the light whose wavelength is 365 nm when molding the polyimide resin into a film-like shape of 30 μm in thickness is not less than 10%, and it is more preferable that the transmittance is not less than 20%. Such a polyimide resin can be synthesized, for example, by reacting acid anhydride represented by formula (2) with the aliphatic ether diamine represented by formula (8) and/or siloxane diamine represented by the formula (9).

In the photosensitive adhesive composition of the present embodiment, it is preferable that the content of the (A) component is 10% by mass to 90% by mass based on the total amount of the solid content in the photosensitive adhesive composition, it is more preferable that the content is 15% by mass to 80% by mass based on the total amount of the solid content in the photosensitive adhesive composition, it is still more preferable that the content is 20% by mass to 70% by mass based on the total amount of the solid content in the photosensitive adhesive composition, and it is most preferable that the content is 30% by mass to 60% by mass based on the total amount of the solid content in the photosensitive adhesive composition. When the content is less than 10% by mass, the developing properties at the time of pattern formation tend to be not sufficient, and the handling properties such as tacking properties are not sufficient; when the content exceeds 90% by mass, the developing properties at the time of pattern formation and the adhesion properties tend to be not sufficient.

In the case where the alkali-solubility of the polyimide resin is poor when blending the polyimide resin as the (A) component, one may add a resin having a carboxyl group and/or a hydroxyl group and/or a resin having a hydrophilic group as a dissolving aid. The resin having a hydrophilic group is not particularly limited as long as the resin is an alkali-soluble resin, and examples thereof include resins having a glycol group such as an ethylene glycol and a propylene glycol group.

Examples of the (B) radiation polymerizable compound include compounds having an ethylenically unsaturated group. Examples of the ethylenically unsaturated group include a vinyl group, an allyl group, a propargyl group, a butenyl group, an ethynyl group, a phenylethynyl group, a maleimide group, a nadimide group, and a (meth)acrylic group. From the viewpoint of reactivity, a (meth)acrylic group is preferable, and it is preferable that the radiation polymerizable compound be (meth)acrylate having a functionality of 2 or more. Such acrylate is not particularly limited, and examples thereof include: diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,2-methacryloyloxy-2-hydroxypropane, methylenebisacrylamide, N,N-dimethylacrylamide, N-methylolacrylamide, triacrylate of tris(β-hydroxyethyl)isocyanurate, compounds represented by the following formula, urethane acrylate or urethane methacrylate, and urea acrylate. In the following formula, $R^{19}$ and $R^{20}$ each independently represent a hydrogen atom or a methyl group, and g and h each independently represent an integer of 1 to 20.

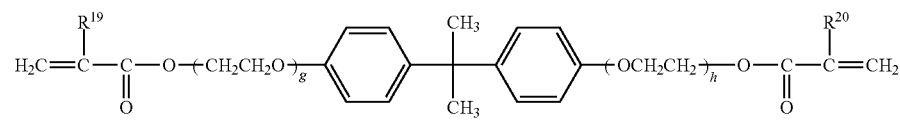

It is possible to use one of the radiation polymerizable compounds alone, or two or more thereof in combination. Among these, the radiation polymerizable compounds represented by the above formula and having a glycol skeleton are preferable from the viewpoint of sufficiently giving the alkali-solubility and the solvent resistance after curing, and isocyanurate di/triacrylate and isocyanurate di/trimethacrylate are preferable from the viewpoint of sufficiently giving the pattern forming properties, high adhesion properties after curing, the heat resistance, and the airtight sealing properties.

It is preferable that the (B) component include an acrylate compound having a functionality of 3 or more. In this case, it is possible to further improve the adhesion properties after curing, as well as to suppress the outgas during heating. It is possible to increase the storage elastic modulus after curing and thereby to obtain good airtight sealing properties.

By using a radiation polymerizable compound whose functional group equivalent is large in combination, reduction in the stress and warpage is enabled. In the radiation polymerizable compound whose functional group equivalent is large, it is preferable that the polymerization functional group equivalent is not less than 200 eq/g, it is more preferable that the polymerization functional group equivalent is not less than 300 eq/g, and it is most preferable that the polymerization functional group equivalent is not less than 400 eq/g. Particularly, by using a radiation polymerizable compound having a polymerization functional group equivalent of not less than 200 eq/g and having a glycol skeleton and a urethane group and/or an isocyanurate group, it is possible to improve the developing properties and adhesion properties of the photosensitive adhesive composition, and reduction in the stress and warpage is enabled.

As the (B) component, the radiation polymerizable compound whose polymerization functional group equivalent is not less than 200 eq/g and a radiation polymerizable compound whose polymerization functional group equivalent is less than 200 eq/g may be used in combination. In this case, as the (B) component, it is preferable to use the radiation polymerizable compound having a urethane group and/or an isocyanurate group.

It is preferable that the content of the (B) component is 10 parts by mass to 500 parts by mass based on 100 parts by mass of the (A) component, it is more preferable that the content is 20 parts by mass to 250 parts by mass based on 100 parts by mass of the (A) component, it is still more preferable that the content is 30 parts by mass to 150 parts by mass based on 100 parts by mass of the (A) component, and it is most preferable that the content is 40 parts by mass to 100 parts by mass based on 100 parts by mass of the (A) component. When the content of the (B) component exceeds 500 parts by mass, fluidity during heat melting is reduced by polymerization, and the adhesion properties during thermal press-bonding tend to be reduced. On the other hand, when the content of the (B) component is less than 10 parts by mass, the solvent resistance after photo-curing by exposure is reduced, and it is difficult to form a pattern. Namely, change in the film thickness before and after development is increased, and a residue tends to be increased. Melting occurs during thermal press-bonding, and the pattern tends to be deformed.

From the viewpoint of improvement in sensitivity, as the (C) component, it is preferable that the molecular extinction coefficient to the light whose wavelength is 365 nm is not less than 1000 ml/g·cm, it is more preferable that the molecular extinction coefficient is not less than 2000 ml/g·cm. The molecular extinction coefficient is determined as follows: one prepares a 0.001% by mass acetonitrile solution as a sample, and using a spectrophotometer (made by Hitachi High-Technologies Corporation, trade name: U-3310), one measures the absorbance of the solution.

In the case where the photosensitive adhesive composition is formed into an adhesive layer whose film thickness is not less than 30 μm, it is preferable from the viewpoint of improvement in sensitivity and internal curing properties that the (C) component be bleached by irradiation with light. Examples of such a (C) component include compounds photobleachable by UV irradiation among aromatic ketones such as 2-benzyl-2-dimethylamino-1-(4-morpholinophenyl)-butanone-1, 2,2-dimethoxy-1,2-diphenylethane-1-one, 1-hydroxy-cyclohexyl-phenyl-ketone, 2-methyl-1-(4-(methylthio)phenyl)-2-morpholinopropanone-1,2,4-diethylthioxanthone, 2-ethylanthraquinone, and phenanthrenequinone; benzyl derivatives such as benzyl dimethyl ketal; 2,4,5-triarylimidazole dimers such as 2-(o-chlorophenyl)-4,5-diphenylimidazole dimers, 2-(o-chlorophenyl)-4,5-di(m-methoxyphenyl)imidazole dimers, 2-(o-fluorophenyl)-4,5-phenylimidazole dimers, 2-(o-methoxyphenyl)-4,5-diphenylimidazole dimers, 2-(p-methoxyphenyl)-4,5-diphenylimidazole dimers, 2,4-di(p-methoxyphenyl)-5-phenylimidazole dimers, and 2-(2,4-dimethoxyphenyl)-4,5-diphenylimidazole dimers; acridine derivatives such as 9-phenylacridine and 1,7-bis(9,9'-acridinyl)heptane; and bisacylphosphine oxides such as bis(2,6-dimethoxybenzoyl)-2,4,4-trimethyl-pentylphosphine oxide, and bis(2,4,6,-trimethylbenzoyl)-phenylphosphine oxide. It is possible to use one of these alone, or two or more thereof in combination.

The (C) component may include a photoinitiator that demonstrates a function to promote the curing reaction such as polymerization and/or an addition reaction of a (D) epoxy resin (hereinafter, referred to as a (D) component in some cases.) and an (E) compound having an ethylenically unsaturated group and an epoxy group (hereinafter, referred to as an (E) component in some cases.) described later by irradiation of radiation. Examples of such a photoinitiator include photo-base generators that generate a base by irradiation, and photoacid generators that generate an acid by irradiation, and the photo-base generators are particularly preferred.

Examples of the radiation include ionizing radiation and non-ionizing radiation; specifically, examples thereof include excimer laser beams such as ArF and KrF, electron beam extreme ultraviolet light, vacuum ultraviolet light, X rays, ion beams, and ultraviolet light such as i rays and g rays.

By using the photo-base generator, the generated base efficiently acts as a curing catalyst for the (D) component and the (E) component. As a result, the crosslinking density of the photosensitive adhesive composition is further increased, and the high temperature adhesion properties of the photosensitive adhesive composition to an adherent and the moisture resistance thereof are improved. By including the photo-base generator in the photosensitive adhesive composition, it is possible to further reduce the outgas when leaving the photosensitive adhesive composition at a high temperature. Further, it is possible to reduce the curing process temperature, and shorten the time.

The base can reduce the remaining carboxyl group and/or hydroxyl group in the (A) component after reaction of the (A) component with the (D) component and/or the (E) component. For this reason, the moisture resistance, the adhesion properties, and the pattern forming properties are improved.

Any photo-base generator can be used without limitation in particular as long as it is a compound that generates a base at the time of irradiation. As a base to be generated, preferred are strongly basic compounds from the viewpoint of the reactivity and the curing rate.

Examples of such a base generated at the time of irradiation include imidazole derivatives such as imidazole, 2,4-dimethylimidazole and 1-methylimidazole; piperazine derivatives such as piperazine and 2,5-dimethylpiperazine; piperidine derivatives such as piperidine and 1,2-dimethylpiperidine; proline derivatives; trialkylamine derivatives such as trimethylamine, triethylamine, and triethanolamine; pyridine derivatives in which the 4-position is replaced with an amino group or an alkylamino group such as 4-methylaminopyridine and 4-dimethylaminopyridine; pyrrolidine derivatives such as pyrrolidine and n-methylpyrrolidine; dihydropyridine derivatives; alicyclic amine derivatives such as tri ethylenediamine and 1,8-diazabiscyclo(5,4,0)undecene-1 (DBU); and benzylamine derivatives such as benzylmethylamine, benzyldimethylamine, and benzyldiethylamine.

As the photo-base generator that generates the base as above by irradiation, it is possible to use, for example, quaternary ammonium salt derivatives, which are described in Journal of Photopolymer Science and Technology, 1999, Vol. 12, pp. 313 to 314, Chemistry of Materials, 1999, Vol. 11, pp. 170 to 176, and the like. Because these quaternary ammonium salt derivatives generate highly basic trialkylamine by irradiation, these are most suitable for curing of the epoxy resin.

It is also possible to use carbamic acid derivatives, which are described in Journal of American Chemical Society, 1996, Vol. 118, p. 12925, Polymer Journal, 1996, Vol. 28, p. 795, and the like.

Further, it is possible to use oxime derivatives that generate a primary amino group by irradiation; commercially available photoradical generators such as 2-methyl-1-(4-(methylthio)phenyl)-2-morpholinopropane-1-one (made by BASF SE, trade name: IRGACURE 907), 2-benzyl-2-dimethylamino-1-(4-morpholinophenyl)-butanone-1 (made by BASF SE, trade name: IRGACURE 369), 2-(dimethylamino)-2-((4-methylphenyl)methyl)-1-(4-(4-morpholinyl)phenyl)-1-butanone (made by BASF SE, trade name: IRGACURE 379), and 3,6-bis-(2-methyl-2-morpholino-propionyl)-9-N-octylcarbazole (made by ADEKA Corporation, trade name: OPTOMER N-1414); hexaarylbisimidazole derivatives (a substituent such as halogen, an alkoxy group, a nitro group, and a cyano group may be substituted by a phenyl group); and benzisoxazolone derivatives.

As the photo-base generator, a compound may be used in which a group that generates a base is introduced into the main chain and/or the side chain of the polymer. As the molecular weight in this case, from the viewpoint of adhesion properties as an adhesive, fluidity, and heat resistance, it is preferable that the weight average molecular weight is 1000 to 100000, and it is more preferable that the weight average molecular weight is 5000 to 30000.

The photo-base generator does not show the reactivity with the (D) component and the (E) component described later at room temperature in the state where the photo-base generator is not irradiated; for this reason, storage stability at room temperature is extremely excellent.

As the (D) epoxy resin, from the viewpoint of the high temperature adhesion properties and the reflow resistance, those containing at least 2 or more epoxy groups in the molecule are preferable; and from the viewpoint of the pattern forming properties, and the thermal press bondability, glycidyl ether epoxy resins that are liquid or semisolid at room temperature (25° C.), and specifically, whose softening temperature is not more than 50° C. are more preferable. Such a resin is not particularly limited, and examples thereof include bisphenol A, AD, S, or F glycidyl ether, hydrogenated bisphenol A glycidyl ether, ethylene oxide adduct bisphenol A glycidyl ether, propylene oxide adduct bisphenol A glycidyl ether, trifunctional or tetrafunctional glycidyl ether, glycidyl ester of dimer acid, and trifunctional or tetrafunctional glycidyl amine. It is possible to use one of these alone, or two or more thereof in combination.

As the (D) component, it is preferable that a 5% mass loss temperature is not less than 150° C., it is more preferable that the temperature is not less than 180° C., it is still more preferable that the temperature is not less than 200° C., and it is most preferable that the temperature is not less than 260° C. If the 5% mass loss temperature is not less than 150° C., low outgas properties, the high temperature adhesion properties, and reflow resistance are improved.

The 5% mass loss temperature is a 5% mass loss temperature by measuring a sample at a temperature raising rate of 10° C./min and under a nitrogen flow (400 ml/min) using a simultaneous thermogravimetry and differential thermal analyzer (made by made by SII NanoTechnology Inc., trade name: TG/DTA6300).

As the (D) component, it is preferable to use the epoxy resin represented by the following structural formula. By using such an epoxy resin, it is possible to sufficiently give the 5% mass loss temperature, the pattern forming properties, the high temperature adhesion properties, the reflow resistance, and the airtight sealing properties.

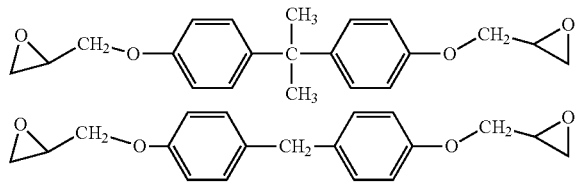

As the (D) component, it is preferable to use high purity products in which impurities ions such as alkali metal ions, alkaline earth metal ions, and halogen ions, and particularly chlorine ions, and hydrolytic chlorine are reduced to not more than 300 ppm. Prevention of electromigration and prevention of corrosion of a metal conducting circuit are enabled.

It is preferable that the content of the (D) component is 5 parts by mass to 300 parts by mass based on 100 parts by mass of the (A) component, and it is more preferable that the content is 10 parts by mass to 100 parts by mass based on 100 parts by mass of the (A) component. When the content exceeds 300 parts by mass, solubility in an alkali aqueous solution is reduced, and the pattern forming properties tend to be reduced. On the other hand, when the content is less than 5 parts by mass, sufficient thermal press bondability and the high temperature adhesion properties tend to be difficult to obtain.

As the content of the (D) component, it is preferable that the total amount of the (D) component and the (E) compound having an ethylenically unsaturated group and an epoxy group described later is not less than 20 parts by mass based on 100 parts by mass of the (A) component, and it is more preferable that the total amount is not less than 30 parts by mass based on 100 parts by mass of the (A) component. In the case where the Tg of the (A) component is not less than 70° C., particularly, it is preferable that the total amount is not less than 30 parts by mass based on 100 parts by mass of the (A) component, it is more preferable that the total amount is not less than 40 parts by mass based on 100 parts by mass of the (A) component, and it is most preferable that the total amount is not less than 50 parts by mass based on 100 parts by mass of the (A) component. By setting the content of the (D) component in the range, it is possible to reduce the melt viscosity after pattern formation, and improve the pattern forming properties, the thermal press bondability, the high temperature adhesion properties, and the airtight sealing properties.

Examples of the ethylenically unsaturated group in the (E) compound having an ethylenically unsaturated group and an epoxy group include a vinyl group, an allyl group, a propargyl group, a butenyl group, an ethynyl group, a phenylethynyl group, a maleimide group, a nadimide group, a (meth)acrylic group; preferred is the (meth)acrylic group from the viewpoint of reactivity.

The (E) component is not particularly limited, and examples thereof include glycidyl methacrylate, glycidyl acrylate, 4-hydroxybutyl acrylate glycidyl ether, and 4-hydroxybutyl methacrylate glycidyl ether, and compounds obtained by reacting a compound having a functional group reactive with an epoxy group and an ethylenically unsaturated group with a polyfunctional epoxy resin. The functional group reactive with an epoxy group is not particularly limited, and examples thereof include an isocyanate group, a carboxyl group, a phenolic hydroxyl group, a hydroxyl group, acid anhydrides, an amino group, a thiol group, and an amide group. It is possible to use one of these compounds alone, or two or more thereof in combination.

The (E) component is obtained, for example, by reacting, in the presence of triphenylphosphine and/or tetrabutylammonium bromide, a polyfunctional epoxy resin having at least two or more epoxy groups in one molecule with 0.1 equivalent to 0.9 equivalent of (meth)acrylic acid based on 1 equivalent of the epoxy group. For example, in the presence of dibutyltin dilaurate, by reacting a polyfunctional isocyanate compound, a hydroxy group-including (meth)acrylate, and a hydroxy group-including epoxy compound, or by reacting a polyfunctional epoxy resin and an isocyanate group-including (meth)acrylate, a glycidyl group-containing urethane (meth)acrylate and the like are obtained.

In the (E) component, it is preferable that the 5% mass loss temperature is not less than 1.50° C., it is more preferable that the temperature is not less than 180° C., it is still more preferable that the temperature is not less than 200° C., and it is most preferable that the temperature is not less than 260° C. When the temperature is not less than 150° C., storage stability, the adhesion properties, low outgas properties of the package at the time of heating in fabrication and after fabrication, the heat resistance, and the moisture resistance are improved.

It is preferable that the (E) component is a high purity product in which impurities ions such as alkali metal ions, alkaline earth metal ions, and halogen ions, and particularly chlorine ions and hydrolytic chlorine are reduced to not more than 1000 ppm. Prevention of electromigration and prevention of corrosion of a metal conducting circuit are enabled.

For example, by using a polyfunctional epoxy resin in which alkali metal ions, alkaline earth metal ions, and halogen ions are reduced as the raw material, it is possible to satisfy the concentration of the impurities ions.

The (E) component that satisfies the heat resistance and the purity is not particularly limited, and examples thereof include those using the followings as a raw material: bisphenol A, AD, S, or F glycidyl ether, hydrogenated bisphenol A glycidyl ether, ethylene oxide adduct bisphenol A and/or F glycidyl ether, propylene oxide adduct bisphenol A and/or F glycidyl ether, glycidyl ether of a phenol novolak resin, glycidyl ether of a cresol novolak resin, glycidyl ether of a bisphenol A novolak resin, glycidyl ether of a naphthalene resin, trifunctional or tetrafunctional glycidyl ether, glycidyl ether of a dicyclopentadiene phenol resin, glycidyl ester of dimer acid, trifunctional or tetrafunctional glycidyl amine, and glycidyl amine of a naphthalene resin.

From the viewpoint of improving the thermal press bondability, low stress properties, and adhesion properties, and keeping the developing properties during pattern formation, it is preferable that the number of the epoxy group and the number of the ethylenically unsaturated group in the (E) component each is 3 or less, and particularly, it is preferable that the number of the ethylenically unsaturated group is 2 or less. Such an (E) component is not particularly limited, and compounds represented by formulas (13) to (18) are preferably used. In formulas (13) to (18), $R^{12}$ and $R^{16}$ represent a hydrogen atom or a methyl group, $R^{10}$, $R^{11}$, $R^{13}$, and $R^{14}$ represent a divalent organic group, $R^{15}$, $R^{17}$, $R^{18}$, and $R^{19}$ represent an epoxy group or an organic group having an ethylenically unsaturated group.

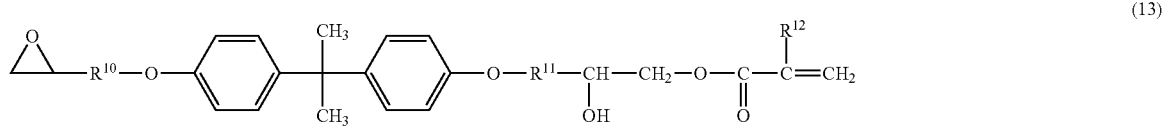

(13)

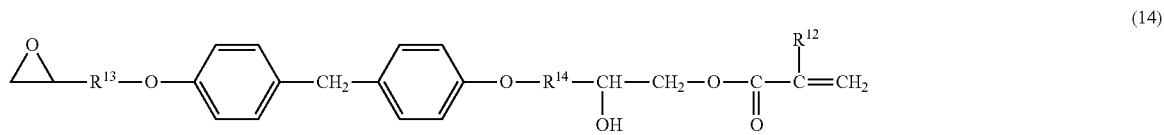

(14)

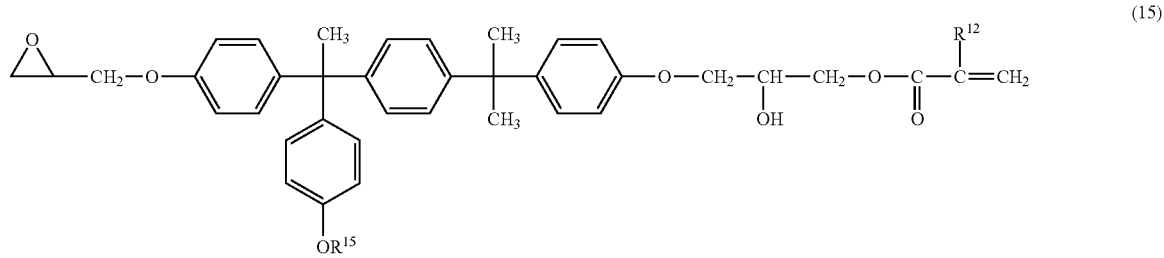

(15)

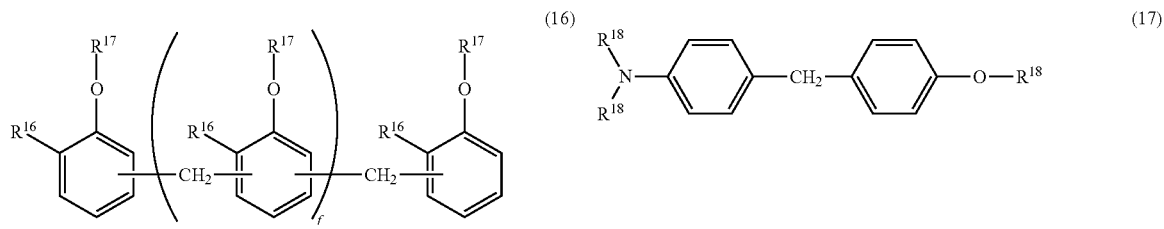

(16)     (17)

As the (E) component, compounds represented by formula (13) or (14) are preferably used. By using these, the thermal press bondability is improved.

In the present embodiment, it is preferable that the content of the (E) component is 5 parts by mass to 300 parts by mass based on 100 parts by mass of the (A) component, it is more preferable that the content is 10 parts by mass to 200 parts by mass based on 100 parts by mass of the (A) component, and it is still more preferable that the content is 20 parts by mass to 100 parts by mass based on 100 parts by mass of the (A) component. When the content exceeds 300 parts by mass, there is a tendency that thixotropic properties are reduced during film formation and the film is difficult to form, and the tacking properties are increased and the handling properties are not sufficient. Moreover, the developing properties tend to be reduced during pattern formation, and the pattern also tends to be deformed during thermal press-bonding because the melt viscosity after photo-curing is reduced. On the other hand, when the content of the (E) component is less than 5 parts by mass, the effect of addition tends not to be obtained sufficiently. The (E) component can serve as a space at the time of photo-curing while keeping the pattern forming properties to reduce the crosslinking density, thereby improving the thermal press bondability significantly.

Other than the (E) component, the photosensitive adhesive composition of the present embodiment may contain a curing agent and a hardening accelerator as a curable component.

Examples of the curing agent include phenol compounds, aliphatic amines, alicyclic amines, aromatic polyamines, polyamides, aliphatic acid anhydrides, alicyclic acid anhydrides, aromatic acid anhydrides, dicyanediamide, organic acid dihydrazide, boron trifluorideamine complexes, imidazoles, and tertiary amines.

Among the curing agents, preferable are phenol compounds, and more preferable are phenol compounds having at least 2 or more phenolic hydroxyl groups in the molecule. By using the phenol compound, the pattern forming properties are improved. Examples of such a compound include phenol novolaks, cresol novolaks, tert-butylphenol novolaks, dicyclopentadiene cresol novolaks, dicyclopentadiene phenol novolaks, xylylene-modified phenol novolaks, naphthol compounds, trisphenol compounds, tetrakis phenol novolaks, bisphenol A novolaks, poly-p-vinylphenols, and phenolaralkyl resins.

Among the phenol compounds, preferred are those whose number average molecular weight is within the range of 400 to 4,000. Thereby, during heating the semiconductor device in fabrication, it is possible to suppress the outgas during heating that causes contamination of the semiconductor element or the semiconductor device. It is preferable that the content of the phenol compound is 1 part by mass to 100 parts by mass based on 100 parts by mass of the (A) component, it is more preferable that the content is 2 parts by mass to 50 parts by mass based on 100 parts by mass of the (A) component, and it is most preferable that the content is 2 parts by mass to 30 parts by mass based on 100 parts by mass of the (A) component. When the content exceeds 100 parts by mass, the reactivity of the compound having an ethylenically unsaturated group and an epoxy group and the radiation polymerizable compound during exposure tends to be poor. Further, if the acid value of the resin is increased, the film thickness tends to be reduced or increased by swelling after development. Moreover, if penetration of the developer into the resin pattern is increased, the outgas in the subsequent heat curing and in a fabrication thermal history is increased, and the heat-resistance reliability and the moisture resistance reliability tends to be significantly reduced. On the other hand, when the content is less than 1 part by mass, sufficient high temperature adhesion properties tend to be not obtained.

As the phenol compound, it is preferable that a phenol compound represented by the following structural formula be used from the viewpoint of a 5% mass loss temperature being high, and sufficiently giving the pattern forming properties. In the phenol compound, it is preferable that the ratio of the mol equivalent of the epoxy group of the epoxy resin in the (D) component and the (E) component to the mol equivalent of the carboxyl group and/or phenolic hydroxyl group in the polymer side chain of the resin composition and the phenolic hydroxyl group of the phenolic compound [epoxy group/(carboxyl group and/or phenolic hydroxyl group)] is 0.5 to 1.5, it is more preferable that the ratio is 0.7 to 1.4, and it is most preferable that the ratio is 0.9 to 1.2. When the ratio of epoxy group/(carboxyl group and/or phenolic hydroxyl group) is less than 0.5, the high temperature adhesion properties, the reflow resistance, and the airtight sealing properties tend to be reduced; when the ratio exceeds 1.5, the pattern forming properties, the high temperature adhesion properties, and the airtight sealing properties tend to be reduced.

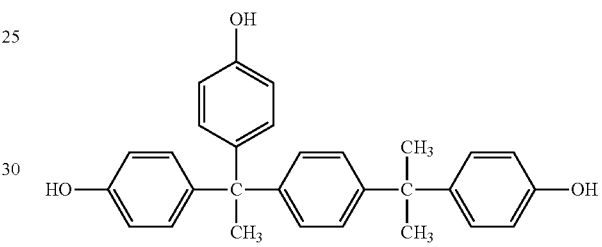

The hardening accelerator is not particularly limited as long as it includes a hardening accelerator that promotes curing and/or polymerization of epoxy by heating. Examples of the hardening accelerator include imidazoles, dicyanediamide derivatives, dicarboxylic acid dihydrazide, triphenylphosphine, tetraphenylphosphonium tetraphenylborate, 2-ethyl-4-methylimidazole-tetraphenylborate, and 1,8-diazabicyclo[5.4.0]undecene-7-tetraphenylborate. It is preferable that the content of the hardening accelerator in the photosensitive adhesive composition is 0.01 part by mass to 50 parts by mass based on 100 parts by mass of the (D) epoxy resin.

In the photosensitive adhesive composition of the present embodiment, it is possible to properly include an (F) filler (hereinafter, referred to as an (F) component in some cases.). Examples of the (F) component include metallic fillers such as silver powder, gold powder, copper powder, and nickel powder; inorganic fillers such as alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, non-crystalline silica, boron nitride, titania, glass, iron oxide, and ceramics; and organic fillers such as carbon and rubber fillers; these can be used without limitation in particular irrespective of the kind and shape thereof.

The (F) component can be used according to a desired function. For example, the metallic filler gives conductivity, thermal conductivity, and thixotropic properties to the resin composition, while the non-metallic inorganic filler gives thermal conductivity, low thermal expansivity, and low moisture absorbing properties to the adhesive layer. The organic filler gives toughness or the like to the adhesive layer.

It is possible to use one of these metallic fillers, inorganic fillers, or organic fillers alone, or two or more thereof in combination. Among these, preferred are metallic fillers, inorganic fillers, or insulating fillers. The conductivity, thermal conductivity, low moisture absorbing properties, and insulation that are demanded of the adhesive material for a semiconductor device are given. Further, among the inorganic fillers or insulating fillers, silica fillers are more preferable. Dispersibility in a resin varnish is good, and a high adhesive force during heating can be given.

In the (F) component, it is preferable that the average particle size is not more than 10 µm, and the largest particle size is not more than 30 µm, and it is more preferable that the average particle size is not more than 5 µm and the largest particle size is not more than 20 µm. When the average particle size exceeds 10 µm and the largest particle size exceeds 30 µm, an effect of improving fracture toughness tends not to be sufficiently obtained. The lower limit of the average particle size and that of the largest particle size are not particularly limited; however, from the viewpoint of the handling properties, it is preferable that both of the lower limit of the average particle size and that of the largest particle size is not less than 0.001 µm.

The content of the (F) component is determined depending on the properties to be given or a function; it is preferable that the content is 0% by mass to 50% by mass based on the total mass of the resin components and the filler, it is more preferable that the content is 1% by mass to 40% by mass, and it is still more preferable that the content is 3% by mass to 30% by mass. By increasing the amount of the filler, lower thermal expansion, reduction in moisture absorption, and a higher elastic modulus can be achieved, and dicing properties (cutting properties with a dicer blade), wire bondability (ultrasonic efficiency), and adhesive strength during heating can be improved.

When the content of the (F) component exceeds 50% by mass, the thermal press bondability and the pattern forming properties are difficult to obtain. In order to balance the properties to be required, one determines the optimal content of the filler. Mixing and kneading of the photosensitive adhesive composition in the case of using the filler can be performed in a proper combination of ordinary dispersion machines such as a stirrer, a kneader, a three-roll mill, and a ball mill.

It is also possible to add a variety of coupling agents to the photosensitive adhesive composition of the present embodiment. By using the coupling agent, coupling properties at an interface between different materials are improved. Examples of the coupling agent include silane coupling agents, titanium coupling agents, and aluminum coupling agents; among these, preferable are silane coupling agents, and more preferable are compounds having a thermosetting group such as an epoxy group and compounds having a radiation polymerizable group such as methacrylate and/or acrylate from the viewpoint of the high effect. Moreover, it is preferable that the boiling point and/or decomposition temperature of the silane coupling agent is not less than 150° C., it is more preferable that the boiling point and/or decomposition temperature of the silane coupling agent is not less than 180° C., and it is still more preferable that the boiling point and/or decomposition temperature of the silane coupling agent is not less than 200° C. Namely, a silane coupling agent having a boiling point and/or decomposition temperature of not less than 200° C. and a thermosetting group such as an epoxy group or a radiation polymerizable group such as methacrylate and/or acrylate is most preferably used. It is preferable that the amount of the coupling agent to be used is 0.01 part by mass to 20 parts by mass based on 100 parts by mass of the (A) component to be used for the effect, heat resistance, and cost.

Further, it is possible to add an ion scavenger to the photosensitive adhesive composition of the present embodiment. Ionic impurities are adsorbed by the ion scavenger to improve insulation reliability at the time of absorbing moisture. Such an ion scavenger is not particularly limited, and examples thereof include compounds, which are known as a copper inhibitor for preventing copper from being ionized and dissolved such as triazinethiol compounds and phenol reducing agents; powder bismuth inorganic compounds; antimony inorganic compounds; magnesium inorganic compounds; aluminum inorganic compounds; zirconium inorganic compounds; calcium inorganic compounds; titanium inorganic compounds; tin inorganic compounds; and inorganic compounds such as mixed inorganic compounds thereof.

Specific examples of the ion scavenger include, but not particularly limited thereto, inorganic ion scavengers made by TOAGOSEI CO., LTD., trade names: IXE-300 (antimony based), IXE -500 (bismuth based), IXE-600 (mixed type of antimony and bismuth), IXE-700 (mixed type of magnesium and aluminum), IXE-800 (zirconium based), and IXE-1100 (calcium based). It is possible to use one of these alone, or two or more thereof by mixing. From the viewpoint of the effect of addition, heat resistance, and cost, it is preferable that the amount of the ion scavenger to be used is 0.01 part by mass to 10 parts by mass based on 100 parts by mass of the (A) component.

In the present embodiment, it is possible to use a sensitizer in combination as required. Examples of the sensitizer include camphorquinone, benzyl, diacetyl, benzyl dimethyl ketal, benzyl diethyl ketal, benzyl di(2-methoxyethyl) ketal, 4,4'-dimethylbenzyl-dimethyl ketal, anthraquinone, 1-chloroanthraquinone, 2-chloroanthraquinone, 1,2-benzanthraquinone, 1-hydroxyanthraquinone, 1-methylanthraquinone, 2-ethylanthraquinone, 1-bromoanthraquinone, thioxanthone, 2-isopropylthioxanthone, 2-nitrothioxanthone, 2-methylthioxanthone, 2,4-dimethylthioxanthone, 2,4-diethylthioxanthone, 2,4-diisopropylthioxanthone, 2-chloro-7-trifluoromethylthioxanthone, thioxanthone-10, 10-dioxide, thioxanthone-10-oxide, benzoin methyl ether, benzoin ethyl ether, isopropyl ether, benzoin isobutyl ether, benzophenone, bis(4-dimethylaminophenyl) ketone, 4,4'-bisdiethylaminobenzophenone, and compounds containing an azido group. It is possible to use one of these alone, or two or more thereof in combination.

In the present embodiment, it is possible to use a thermal radical generator as required. It is preferable that the thermal radical generator be an organic peroxide. As the organic peroxide, preferable are those in which a 1-minute half-life temperature be not less than 120° C., and more preferable are those in which a 1-minute half-life temperature be not less than 150° C. The organic peroxide is selected considering the conditions for preparation of the photosensitive adhesive composition, the film forming temperature, the curing (applying) conditions, other process conditions, and storage stability.

Examples of usable organic peroxides include, but not particularly limited thereto, 2,5-dimethyl-2,5-di(tert-butylperoxyhexane), dicumyl peroxide, tert-butylperoxy-2-ethylhexanoate, tert-hexylperoxy-2-ethylhexanoate 1,1-bis(tert-buty peroxy)-3,3,5-trimethycyclohexane, 1,1-bis(tert-hexylperoxy)-3,3,5-trimethylcyclohexane, and bis(4-tert-butylcyclohexyl)peroxydicarbonate; it is possible to use one of these alone, or two or more thereof by mixing.

It is preferable that the proportion of the amount of the thermal radical generator to be added is 0.01% by mass to 20% by mass based on the total amount of the compound having an ethylenically unsaturated group, it is more preferable that the proportion is 0.1% by mass to 10% by mass, and it is most preferable that the proportion is 0.5% by mass to 5% by mass. When the proportion is less than 0.01% by mass, curing properties are reduced, and the effect of addition tends to be reduced. When the proportion exceeds 5% by mass, the amount of the outgas is increased, and the storage stability tends to be reduced.

The thermal radical generator is not particularly limited as long as it is a compound whose half-life temperature is not less than 120° C.; examples thereof include PERHEXA 25B (made by NOF CORPORATION), 2,5-dimethyl-2,5-di(tert-butylperoxyhexane) (1-minute half-life temperature: 180° C.), PERCUMYL D (made by NOF CORPORATION), and dicumyl peroxide (1-minute half-life temperature: 175° C.).

To the photosensitive adhesive composition of the present embodiment, one may further add a polymerization inhibitor such as quinones, polyhydric phenols, phenols, phosphites, and sulfurs, or an antioxidant in a range that does not impair the curing properties. The storage stability, process adaptivity, or oxidation preventing properties are given.

In the photosensitive adhesive composition of the present embodiment, from the viewpoint of improvement in the airtight sealing properties and the handling properties and suppression of the warpage after heat curing, it is preferable that the Tg of the (A) alkali-soluble resin is 40° C. to 150° C. Examples of the photosensitive resin composition including the alkali-soluble resin having such a Tg in which the storage elastic modulus at 110° C. after heat curing satisfies not less than 10 MPa include those in which 20 parts by mass to 500 parts by mass and preferably 40 parts by mass to 200 parts by mass of the (B) radiation polymerizable compound in which the radiation polymerizable group equivalent is not more than 400 g/eq, and preferably not more than 250 g/eq, 0.5 part by mass to 20 parts by mass and preferably 1 part by mass to 10 parts by mass of the (C) photoinitiator, 5 parts by mass to 300 parts by mass and preferably 10 parts by mass to 100 parts by mass of the (D) epoxy resin in which the epoxy group equivalent is not more than 400 g/eq, and preferably not more than 250 g/eq, and 5 parts by mass to 200 parts by mass and preferably 10 parts by mass to 100 parts by mass of the (E) compound having an ethylenically unsaturated group and an epoxy group and having an aromatic or isocyanurate group are blended based on 100 parts by mass of the (A) alkali-soluble resin whose Tg is 40° C. to 150° C. Contrary to this, in the photosensitive resin composition including an alkali-soluble resin having a Tg of less than 40° C. in which the storage elastic modulus at 110° C. after heat curing satisfies not less than 10 MPa, for example, the photosensitive resin composition obtained by blending not less than 600 parts by mass and preferably not less than 800 parts by mass of the (B) radiation polymerizable compound having a functionality of 2 or more in which the functional group equivalent is not more than 200 g/eq and/or the thermosetting resin ((D) epoxy resin) in which the functional group equivalent is not more than 200 g/eq based on 100 parts by mass of the (A) alkali-soluble resin whose Tg is less than 40° C., the airtightness of the hollow portion can be sufficient while the handling properties at the time of forming the photosensitive resin composition into a film-like shape tend not to be sufficient and the warpage after curing tends to be increased.

In the photosensitive adhesive composition of the present embodiment, from the viewpoint of improvement in the airtight sealing properties and the handling properties and suppression of the warpage after heat curing, it is preferable that the storage elastic modulus at 110° C. after exposure and further heat curing is not more than 1 GPa. Examples of the photosensitive adhesive composition that satisfies such a condition include those in which 20 parts by mass to 500 parts by mass and preferably 40 parts by mass to 200 parts by mass of the (B) radiation polymerizable compound in which the radiation polymerizable group equivalent is not more than 400 g/eq, and preferably not more than 250 g/eq, 0.5 part by mass to 20 parts by mass and preferably 1 part by mass to 10 parts by mass of the (C) photoinitiator, 5 parts by mass to 300 parts by mass and preferably 10 parts by mass to 100 parts by mass of the (D) epoxy resin in which the epoxy group equivalent is not more than 400 g/eq, and preferably not more than 250 g/eq, and 5 parts by mass to 200 parts by mass and preferably 10 parts by mass to 100 parts by mass of the (E) compound having an ethylenically unsaturated group and an epoxy group and having an aromatic or isocyanurate group are blended based on 100 parts by mass of the (A) alkali-soluble resin whose Tg is 40° C. to 150° C. Contrary to this, in the photosensitive resin composition whose storage elastic modulus is more than 1 GPa, for example, the photosensitive resin composition which Tg of the (A) alkali-soluble resin exceeds 150° C., or, the photosensitive resin composition obtained by blending 300 parts by mass to 400 parts by mass of the (B) radiation polymerizable compound having a functionality of 2 or more in which the functional group equivalent is not more than 200 g/eq and/or the thermosetting resin ((D) epoxy resin) in which the functional group equivalent is not more than 200 g/eq based on 100 parts by mass of the (A) alkali-soluble resin whose Tg is not more than 150° C., the airtightness of the hollow portion can be sufficient while the handling properties at the time of forming the photosensitive resin composition into a film-like shape tend not to be sufficient and the warpage after curing tends to be increase.

By molding the photosensitive adhesive composition into a film-like shape, a film-like adhesive can be obtained. FIG. 1 is an end surface view showing one embodiment of a film-like adhesive. A film-like adhesive 1 shown in FIG. 1 is obtained by molding the photosensitive adhesive composition into a film-like shape.

Figure 2:
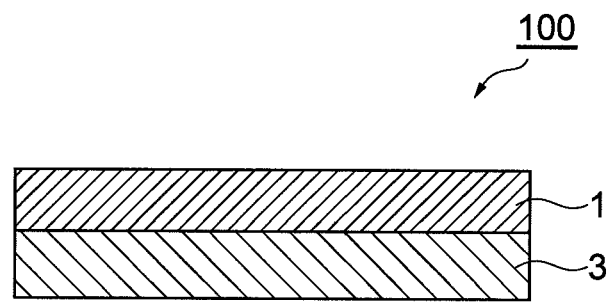
FIG. 2 is an end surface view showing one embodiment of an adhesive sheet.

The film-like adhesive 1 is molded into a film-like shape, for example, by applying the photosensitive adhesive composition onto a base material 3 shown in FIG. 2, and drying the photosensitive adhesive composition. Thus, an adhesive sheet 100 comprising the base material 3, and the adhesive layer 1 formed on the base material 3 and composed of the film-like adhesive is obtained. FIG. 2 is an end surface view showing one embodiment of the adhesive sheet 100. The adhesive sheet 100 shown in FIG. 2 is constituted of the base material 3, and the adhesive layer 1 provided on one surface thereof and composed of the film-like adhesive.

Figure 3:
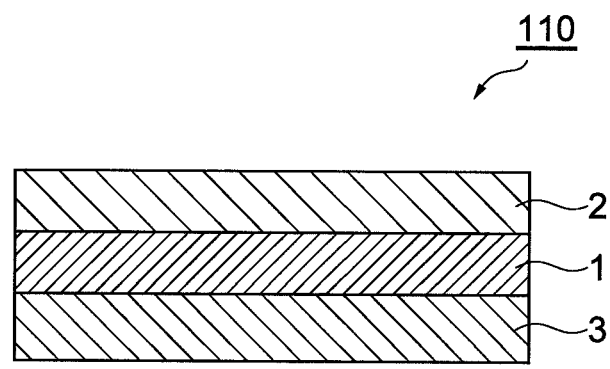
FIG. 3 is an end surface view showing one embodiment of an adhesive sheet.

FIG. 3 is an end surface view showing another embodiment of the adhesive sheet. An adhesive sheet 110 shown in FIG. 3 is constituted of the base material 3, the adhesive layer 1 provided on the one surface thereof and composed of the film-like adhesive, and a cover film 2.

The film-like adhesive 1 can be obtained by the following method. First, one mixes the (A) component, the (B) component, the (C) component, and other components to be added as required in an organic solvent and kneads the mixed solution to prepare a varnish. Next, one applies the varnish onto the base material 3 to form a layer of the varnish; dries the varnish layer by heating, and then removes the base material 3. At this time, it is also possible, without removing the base material 3, to preserve or use in a state of the adhesive sheet 100 or 110.

The organic solvent used for preparation of the varnish, namely the varnish solvent is not particularly limited as long as it can uniformly dissolve or disperse the material. Examples of the organic solvent include dimethylformamide, toluene, benzene, xylene, methyl ethyl ketone, tetrahydrofuran, ethyl cellosolve, ethyl cellosolve acetate, dioxane, cyclohexanone, ethyl acetate, and N-methyl-pyrrolidinone (N-methyl-2-pyrrolidone).

The mixing and kneading can be performed in a proper combination of ordinary dispersion machines such as a stirrer, a kneader, a three-roll mill, and a ball mill. The drying by heating is performed at a temperature at which the (B) component does not sufficiently react and under the condition that the solvent be sufficiently volatilized. The "temperature at which the (B) component does not sufficiently react" is specifically a temperature of the reaction heat of not more than the peak temperature when using a DSC (for example, made by PerkinElmer Inc., trade name: DSC-7 type), and measuring under the conditions of the amount of the sample: 10 mg, the temperature raising rate: 5° C./min, the measurement atmosphere: air. Specifically, usually, by heating at 60° C. to 180° C. for 0.1 minute to 90 minutes, the varnish layer is dried. It is preferable that the thickness of the varnish layer before drying is 1 µm to 200 µm. When the thickness is less than 1 µm, a bonding and fixing function tends not to be sufficient; when the thickness exceeds 200 µm, the remaining volatile content described later tends to be increased.

It is preferable that the remaining volatile content in the obtained varnish layer is not more than 10% by mass. When the remaining volatile content exceeds 10% by mass, voids are likely to remain within the adhesive layer due to foaming by volatilization of the solvent during heating in fabrication, and the moisture resistance tends to be reduced. The possibility that the surrounding material or member may be contaminated by the volatile component generated during heating tends to be higher. The condition on measurement of the remaining volatile component is as follows. Namely, in the film-like adhesive 1 cut into a size of 50 mm×50 mm, the initial mass is M1, and the mass after heating the film-like adhesive 1 in an oven at 160° C. for 3 hours is M2, the remaining volatile content (%) is determined by the following equation.

$$\text{Remaining volatile content}(\%) = [(M1 - M2)/M1] \times 100$$

The base material 3 is not particularly limited as long as it endures the drying condition above. For example, it is possible to use a polyester film, a polypropylene film, a polyethylene terephthalate film, a polyimide film, a polyetherimide film, a polyether naphthalate film, and a methylpentene film as the base material 3. The film for the base material 3 may be a multi-layer film in combination of two or more thereof, or a film whose surface is treated with a mold release agent such as silicone mold release agents and silica mold release agents.

It is also possible to laminate the film-like adhesive 1 and a dicing sheet to form an adhesive sheet. The dicing sheet is a sheet in which a tackifier layer is provided on the base material; the tackifier layer may be one of a pressure sensitive layer or a radiation curable layer. It is preferable that the base material be an expandable base material. By preparing such an adhesive sheet, a dicing and die bonding integrated adhesive sheet having a function as a die bonding film and a function as a dicing sheet is obtained.

Figure 4:
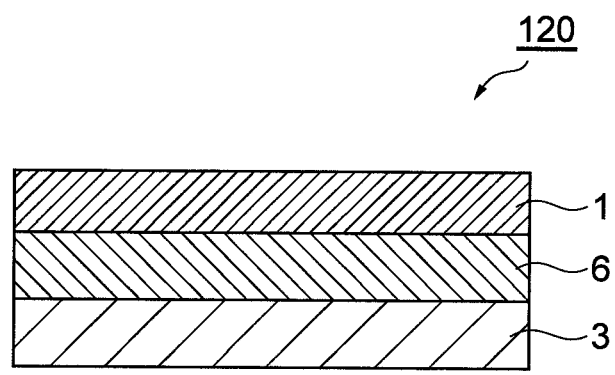
FIG. 4 is an end surface view showing one embodiment of an adhesive sheet.

Examples of the dicing and die bonding integrated adhesive sheet specifically include an adhesive sheet 120 as shown in FIG. 4, which is prepared by laminating the base material 3, the tackifier layer 6, and the film-like adhesive (adhesive layer) 1 in this order.

Figure 5:
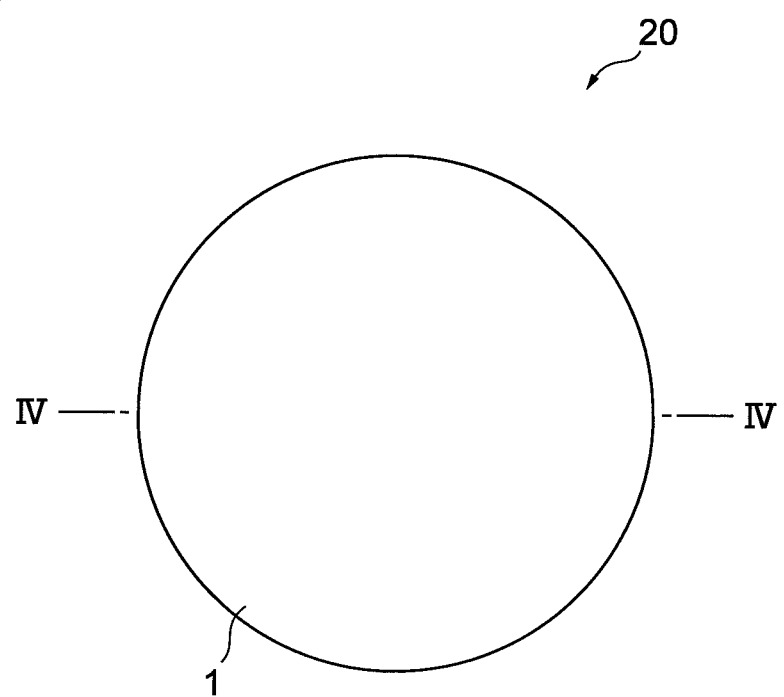
FIG. 5 is a top view showing one embodiment of a semiconductor wafer with an adhesive layer.
Figure 6:
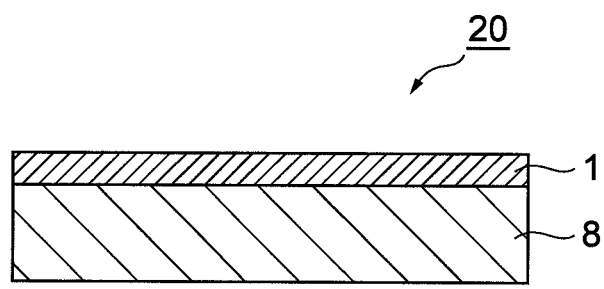
FIG. 6 is an end surface view taken along a line IV-IV in FIG. 5.

FIG. 5 is a top view showing one embodiment of a semiconductor wafer with an adhesive layer, and FIG. 6 is an end surface view taken along the line IV-IV in FIG. 5. A semiconductor wafer with an adhesive layer 20 shown in FIG. 5, and FIG. 6 comprises a semiconductor wafer 8, and the film-like adhesive (adhesive layer) 1 provided on one surface thereof.

The semiconductor wafer with an adhesive layer 20 is obtained by laminating the film-like adhesive 1 on the semiconductor wafer 8 while heating is performed. The film-like adhesive 1 can be applied to the semiconductor wafer 8, for example, at a low temperature of room temperature (25° C.) to approximately 150° C.

Figure 7:
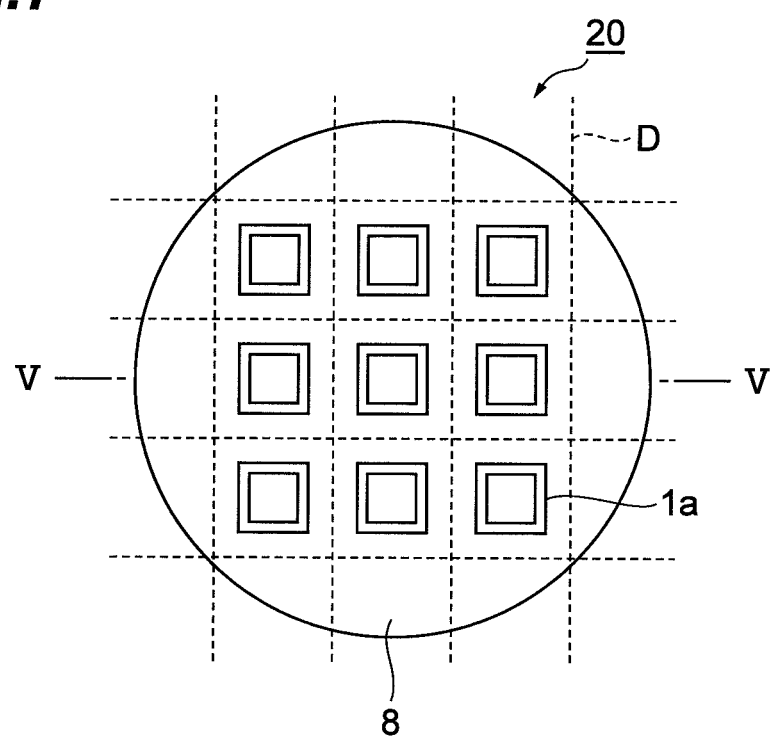
FIG. 7 is a top view showing one embodiment of an adhesive pattern.
Figure 8:
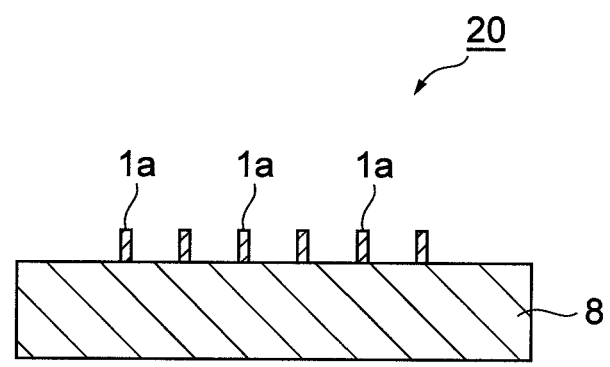
FIG. 8 is an end surface view taken along a line V-V in FIG. 7.
Figure 9:
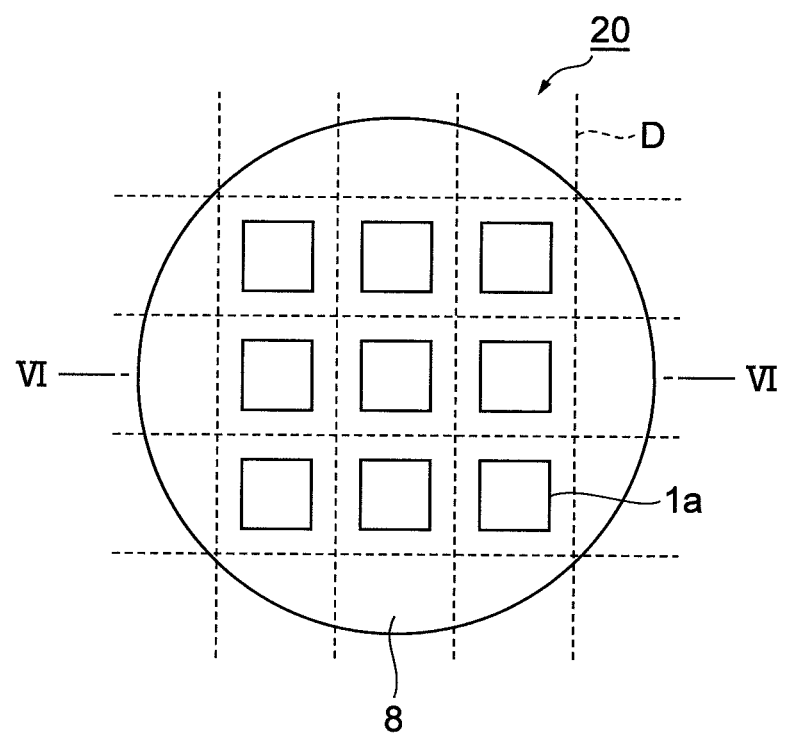
FIG. 9 is a top view showing one embodiment of an adhesive pattern.
Figure 10:
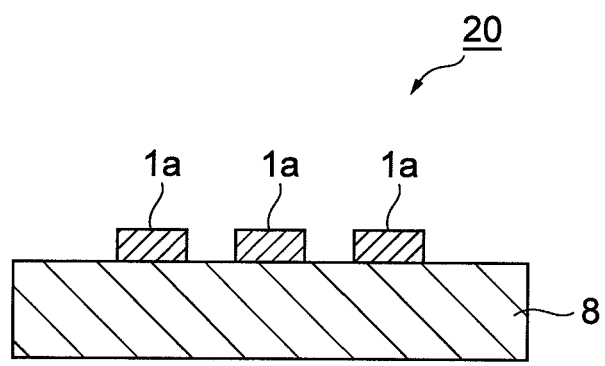
FIG. 10 is an end surface view taken along a line VI-VI in FIG. 9.

FIG. 7 and FIG. 9 each are a top view showing one embodiment of an adhesive pattern; FIG. 8 is an end surface view taken along the line V-V in FIG. 7; FIG. 10 is an end surface view taken along the line VI-VI in FIG. 9. An adhesive pattern 1a shown in FIG. 7 to FIG. 10 is formed on the semiconductor wafer 8 as the adherent so as to have a pattern along the sides of an approximate square or a pattern of a square.

The adhesive pattern 1a is formed as follows: one laminates the adhesive layer 1 on the semiconductor wafer 8 as the adherent to obtain the semiconductor wafer with the adhesive layer 20, exposes the adhesive layer 1 through a photomask, and performs the developing treatment on the adhesive layer 1 after exposure with an alkali developer. Thereby, the semiconductor wafer with the adhesive layer 20 in which the adhesive pattern 1a is formed is obtained.

Hereinafter, a semiconductor device produced by using the film-like adhesive according to the present embodiment will be specifically described using the drawings. Application of the film-like adhesive of the present embodiment will not be limited to the semiconductor device with a structure described below.

Figure 11:
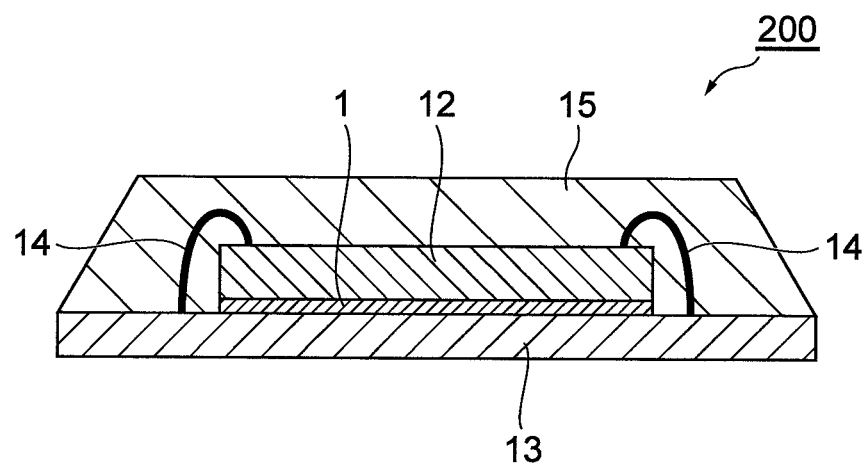
FIG. 11 is an end surface view showing one embodiment of a semiconductor device.

FIG. 11 is an end surface view showing one embodiment of a semiconductor device. In a semiconductor device 200 shown in FIG. 11, a semiconductor element 12 is bonded to a semiconductor element-mounting support member 13 by the film-like adhesive 1; the connection terminal (not shown) of the semiconductor element 12 is electrically connected to an external connection terminal (not shown) by a wire 14; the semiconductor device 200 is sealed by a sealing material 15.

Figure 12:
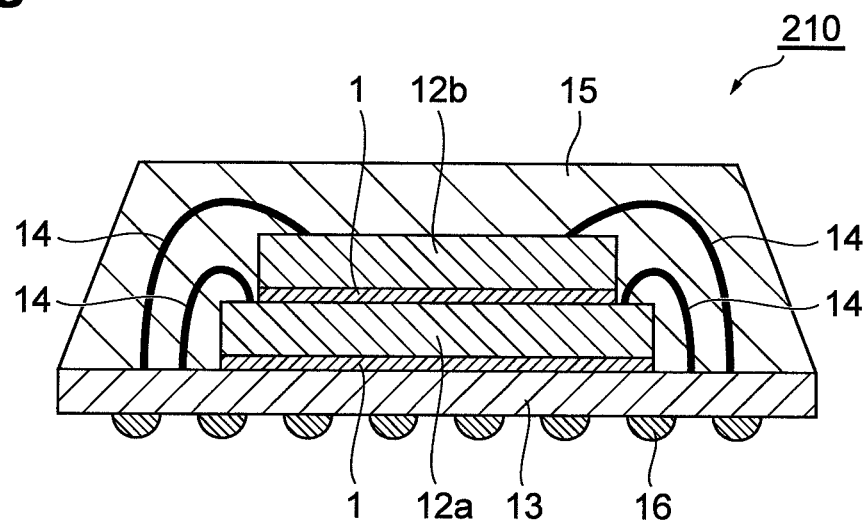
FIG. 12 is an end surface view showing one embodiment of a semiconductor device.

FIG. 12 is an end surface view showing another embodiment of the semiconductor device. In a semiconductor device 210 shown in FIG. 12, a first tier of a semiconductor element 12a is bonded by the film-like adhesive 1 to the semiconductor element-mounting support member 13 on which a terminal 16 is formed; a second tier of a semiconductor element 12b is further bonded onto the first tier of the semiconductor element 12a by the film-like adhesive 1. The connection terminals (not shown) of the first tier of the semiconductor element 12a and the second tier of the semiconductor element 12b are electrically connected to an external connection terminal by the wire 14; the semiconductor device 210 is sealed by the sealing material 15. Thus, the film-like adhesive of the present embodiment can be suitably used for a semiconductor device with a structure in which several semiconductor elements are layered.

The semiconductor devices (semiconductor packages) shown in FIG. 11 and FIG. 12 can be obtained as follows, for example: one dices the semiconductor wafer with an adhesive layer 20 shown in FIG. 9 along a dashed line D; heats and press-bonds the semiconductor element with an adhesive layer after dicing to the semiconductor element-mounting support member 13 to bond the semiconductor element to the support member; subsequently, performs a wire bonding step, and when necessary, the steps such as a sealing step by a sealing material. The heating temperature in the heating and press-bonding is usually 20° C. to 250° C.; the load is usually, 0.01 kgf to 20 kgf; the heating time is usually for 0.1 second to 300 seconds.

Figure 13:
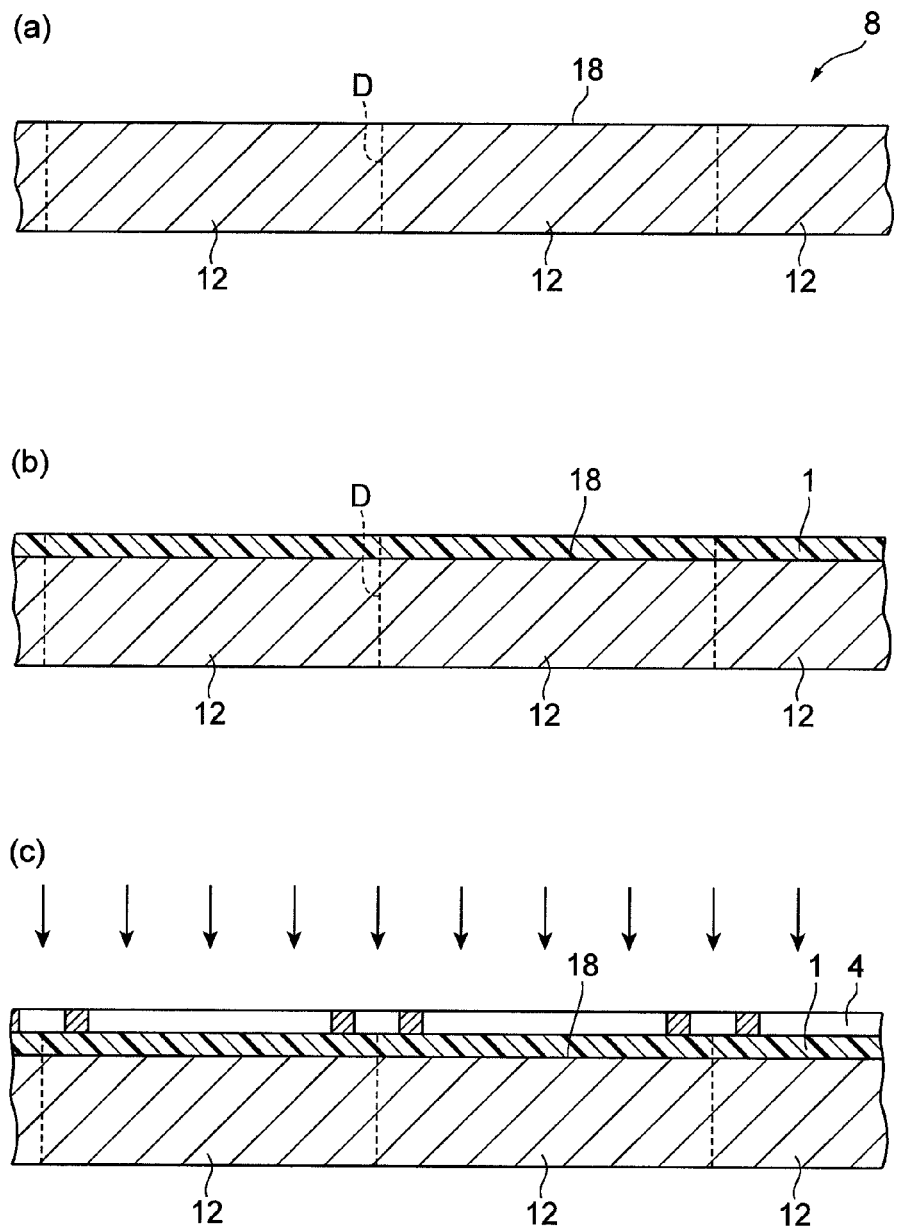
FIG. 13 is a sectional view showing one embodiment of a method for producing a semiconductor device.
Figure 17:
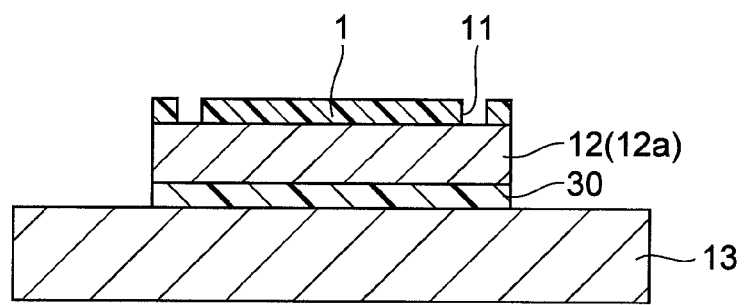
FIG. 17 is an end surface view showing one embodiment of a method for producing a semiconductor device.
Figure 17:
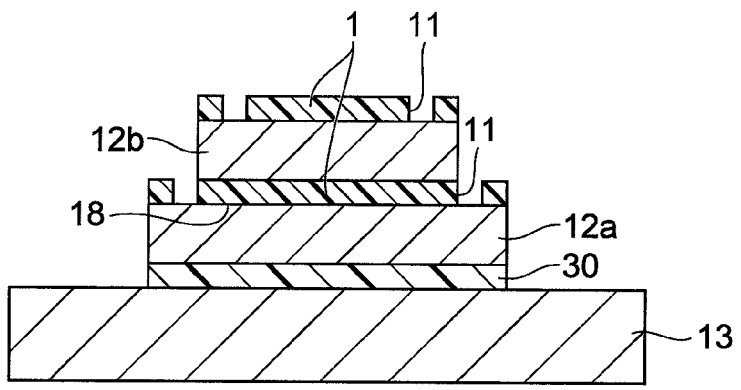
Figure 18:
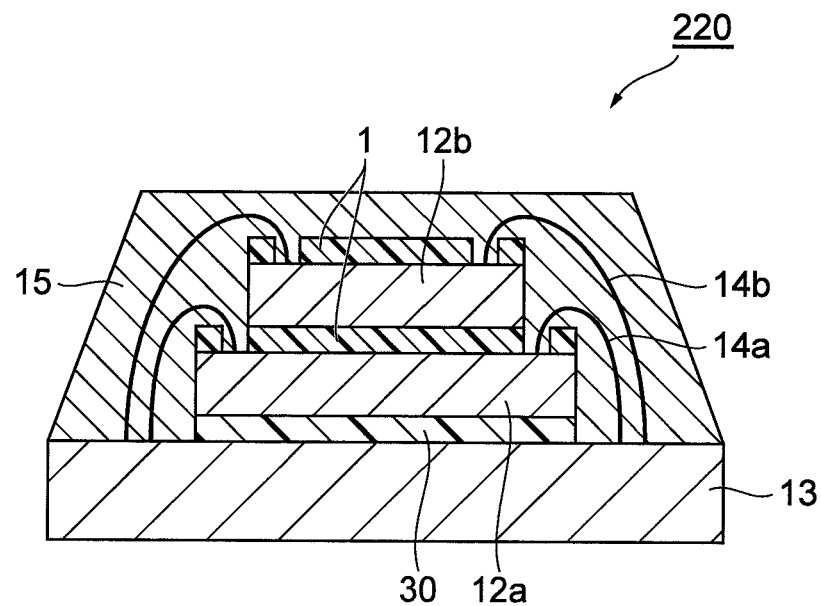
FIG. 18 is an end surface view showing one embodiment of a method for producing a semiconductor device.

Besides, embodiments of the semiconductor device of the present embodiment include a semiconductor device 220 shown in FIG. 18. Hereinafter, a method for producing the semiconductor device 220 shown in FIG. 18 will be described in detail using the drawings. FIG. 13 is a sectional view showing one embodiment of a method for producing a semiconductor device; FIG. 14, and FIG. 16 to FIG. 19 are an end surface view showing one embodiment of a method for producing a semiconductor device; FIG. 15 is a top view showing one embodiment of a method for producing a semiconductor device.

The method for producing the semiconductor device 220 of the present embodiment comprises the following (Step 1) to (Step 7).

(Step 1) A step of laminating the film-like adhesive (adhesive layer) 1 on a surface of a circuit 18 of the semiconductor chip (semiconductor element) 12 formed in the semiconductor wafer 8 (FIGS. 13(*a*) and 13(*b*)).

Figure 14:
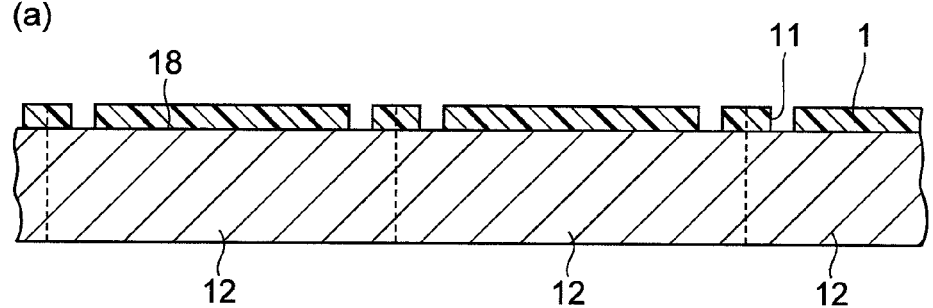
FIG. 14 is an end surface view showing one embodiment of a method for producing a semiconductor device.
Figure 14:
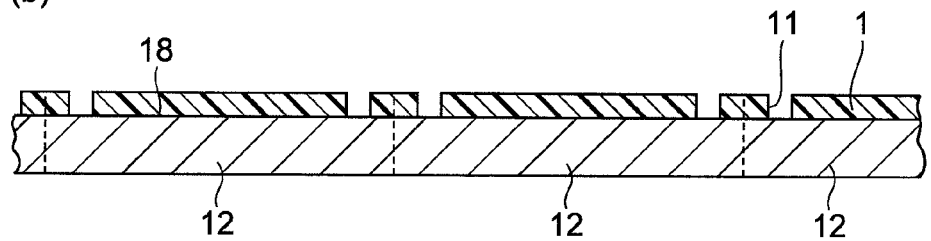
Figure 14:
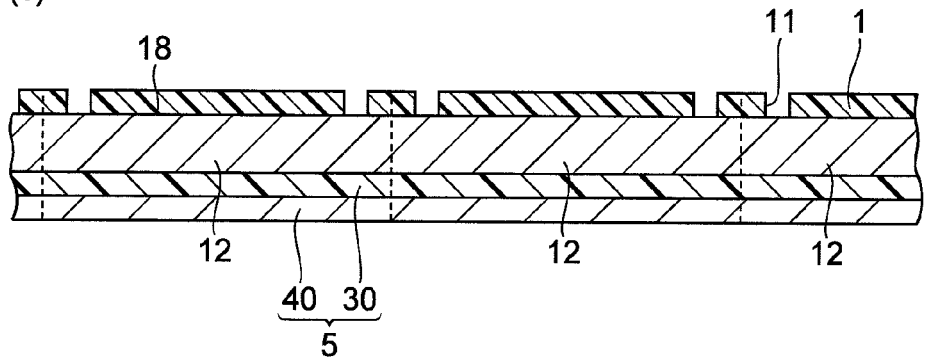
Figure 15:
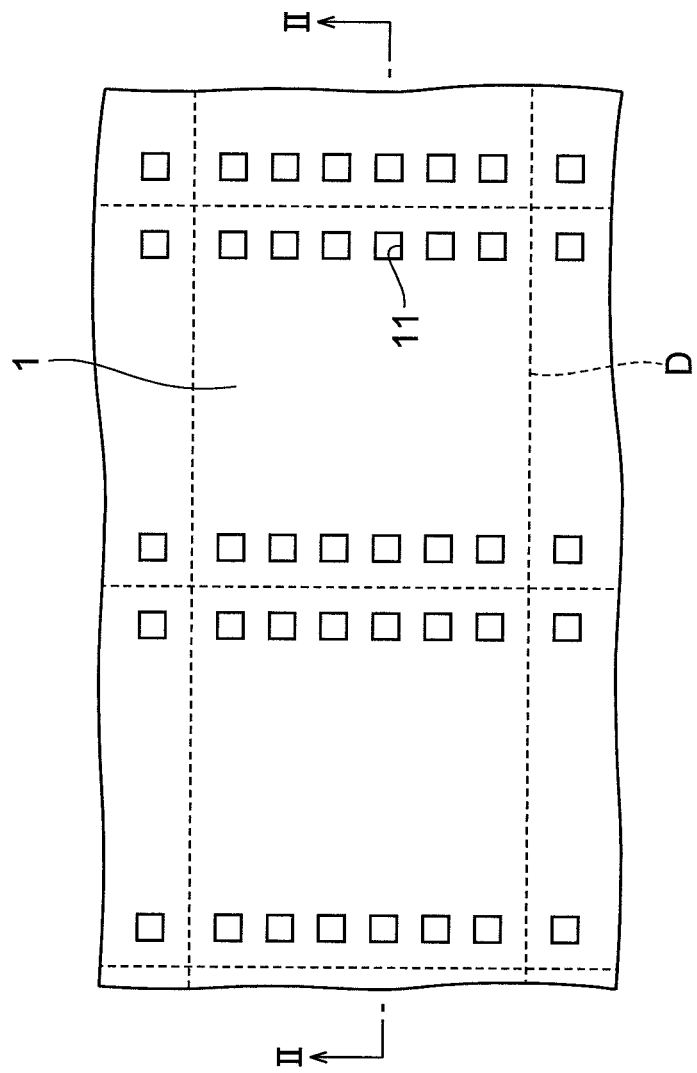
FIG. 15 is a top view showing one embodiment of a method for producing a semiconductor device.

(Step 2) A step of patterning the adhesive layer 1 provided on the surface of the circuit 18 of the semiconductor chip 12 by exposure through a mask 4 and development (FIG. 13(*c*) and FIG. 14(*a*)).

(Step 3) A step of polishing a surface of the semiconductor wafer 8 on the side opposite to the surface of the circuit 18 to make the semiconductor wafer 8 thinner (FIG. 14(*b*)).

Figure 16:
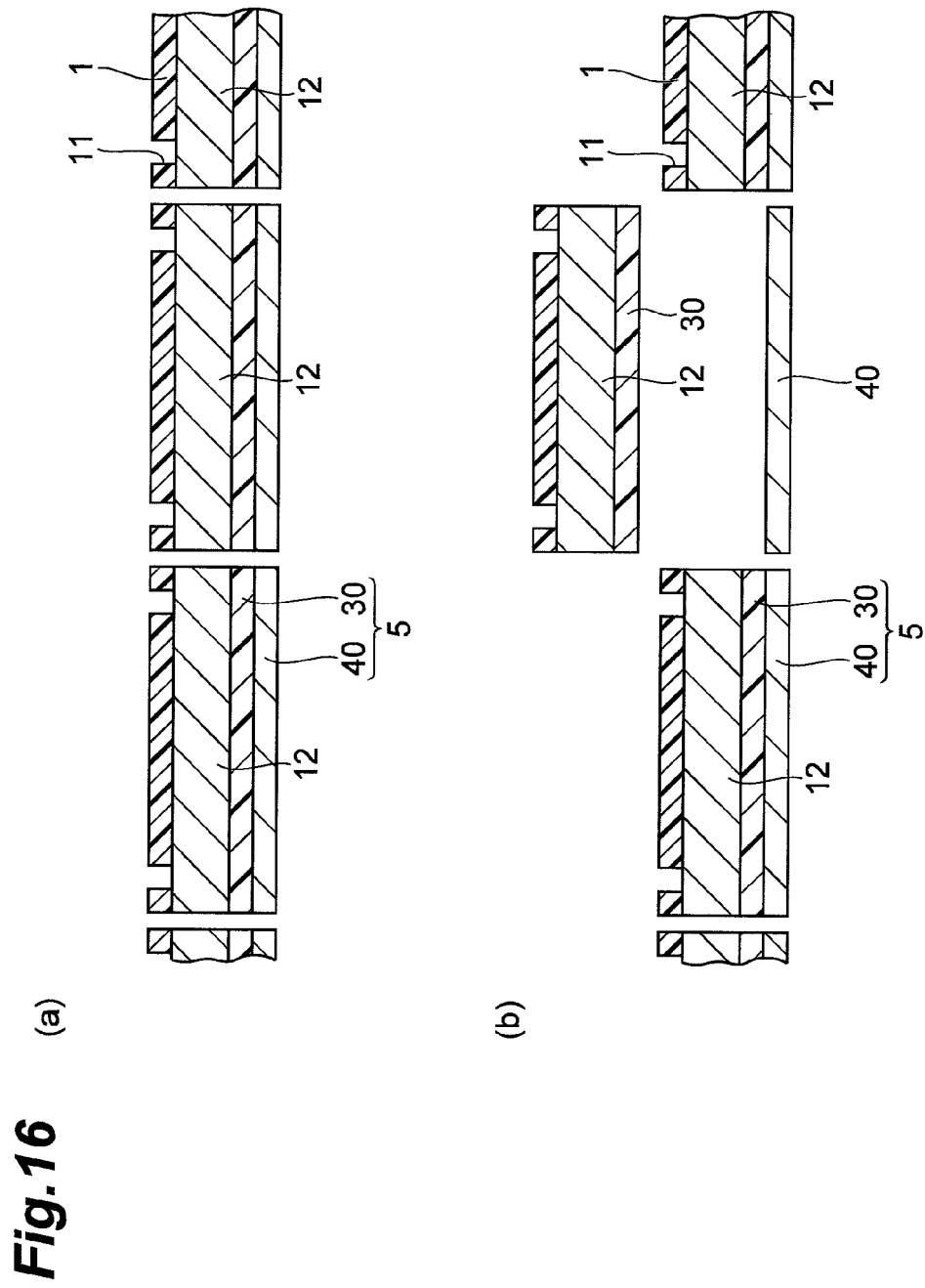
FIG. 16 is an end surface view showing one embodiment of a method for producing a semiconductor device.

(Step 4) A step of cutting the semiconductor wafer 8 into a plurality of the semiconductor chips 12 by dicing (FIG. 14(*c*) and FIG. 16(*a*)).

(Step 5) A step of picking up the semiconductor chip 12 to mount the semiconductor chip 12 on a plate-like support member (semiconductor element-mounting support member) 13 for the semiconductor device (FIG. 16(*b*) and FIG. 17(*a*)).

(Step 6) A step of laminating the second layer of the semiconductor chip 12*b* on the adhesive layer 1, which is patterned on the surface of the circuit 18 of the semiconductor chip 12*a* mounted on the support member 13 (FIG. 17(*b*)).

(Step 7) A step of connecting the semiconductor chips 12*a* and 12*b* to external connection terminals, respectively (FIG. 18).

Hereinafter, (Step 1) to (Step 7) will be described in detail.

(Step 1)

Within the semiconductor wafer 8 shown in FIG. 13(*a*), a plurality of the semiconductor chips 12 are formed by dividing the semiconductor wafer 8 by the dicing line D. One laminates the film-like adhesive (adhesive layer) 1 on the surface of the semiconductor chip 12 on the side of the surface of the circuit 18 (FIG. 13(*b*)). As a method for laminating the adhesive layer 1, a method in which one prepares a film-like adhesive molded into a film-like shape in advance, and applies the film-like adhesive to the semiconductor wafer 8 is simple; or a method in which using a spin coating method or the like, one applies a varnish of a liquid photosensitive adhesive composition onto the semiconductor wafer 8, and heats and dries may be used.

(Step 2)

The adhesive layer 1 is a photosensitive adhesive that has the adhesion properties to the adherent after the adhesive layer 1 is patterned by exposure and development, and enables alkali development. More specifically, a resist pattern (adhesive pattern) formed by patterning the adhesive layer 1 by exposure and development has the adhesion properties to the adherent such as the semiconductor chip and the support member. For example, by press-bonding the adherent to the adhesive pattern while heating is performed as required, it is possible to bond the adhesive pattern and the adherent to each other.

One irradiates the adhesive layer 1 laminated on the semiconductor wafer 8 with an active light beam (typically, ultraviolet rays) through the mask 4 in which an opening is formed in a predetermined position (FIG. 13(*c*)). Thereby, the adhesive layer 1 is exposed in a predetermined pattern.

After exposure, one patterns the adhesive layer 1 such that an opening 11 is formed by removing the portion of the adhesive layer 1 not exposed by development using an alkali developer (FIG. 14(*a*)). Instead of a negative photosensitive adhesive composition, it is also possible to use a positive photosensitive adhesive composition; in this case, the exposed portion of the adhesive layer 1 is removed by development.

FIG. 15 is a top view showing a state where the adhesive layer 1 is patterned. In the opening 11, a bonding pad of the semiconductor chip 12 is exposed. Namely, the patterned adhesive layer 1 is a buffer coating film for the semiconductor chip 12. A plurality of rectangular openings 11 are formed in a row on each of the semiconductor chips 12. A shape, disposition and number of the opening 11 will not be limited to the form in the present embodiment, and modifications can be properly made so that a predetermined portion such as the bonding pad is exposed. FIG. 14 is an end surface view taken along the line II-II in FIG. 15.

(Step 3)

After patterning, one polishes the surface of the semiconductor wafer 8 on the side opposite to the adhesive layer 1 to make the semiconductor wafer 8 thinner to a predetermined thickness (FIG. 14(*b*)). Polishing is performed, for example, by applying a tacky film onto the adhesive layer 1 to fix the semiconductor wafer 8 to a polishing jig by the tacky film.

(Step 4)

After polishing, one applies a composite film 5 having a die bonding material 30 and a dicing tape 40 that are laminated thereon onto the surface on the side opposite to the adhesive layer 1 of the semiconductor wafer 8 in the direction in which the die bonding material 30 contacts the semiconductor wafer 8 (FIG. 14(*c*)). Application is performed while heating is performed as required.

Next, one cuts the semiconductor wafer 8 with the adhesive layer 1 and the composite film 5 along the dicing line D. Thereby, a plurality of the semiconductor chips 12 each comprising the adhesive layer 1 and the composite film 5 is obtained (FIG. 16(*a*)). The dicing is performed, for example, using a dicing blade in a state of fixing the entire wafer to a frame with the dicing tape 40.

(Step 5)

After dicing, one picks up each of the cut semiconductor chips 12 (12*a*) with the adhesive layer 1 and the die bonding material 30 (FIG. 16(*b*)), and mounts on the support member 13 with the die bonding material 30 therebetween (FIG. 17(*a*)).

(Step 6)

One laminates the second layer of the semiconductor chip 12*b* on the adhesive layer 1 on the semiconductor chip 12*a* mounted on the support member 13 (FIG. 17(*b*)). Namely, the semiconductor chip 12*a* and the semiconductor chip 12*b* located thereon are bonded to each other by the patterned adhesive layer 1 (buffer coating film) interposed therebetween. The semiconductor chip 12*b* is bonded in a position at which the openings 11 are not closed in the patterned adhesive layer 1. The patterned adhesive layer 1 (buffer coating film) is also formed on the surface of the circuit 18 provided on the semiconductor chip 12*b*.

Bonding of the semiconductor chip 12*b* is performed, for example, by a method in which thermal press-bonding is performed while heating is performed to a temperature at which the adhesive layer 1 demonstrates fluidity. After thermal press-bonding, when necessary, the adhesive layer 1 is heated to further progress curing.

(Step 7)

Subsequently, the semiconductor chip 12a is connected to an external connection terminal on the support member 13 by a wire 14a connected to a bonding pad provided on the semiconductor chip 12a; the semiconductor chip 12b is connected to an external connection terminal on the support member 13 by a wire 14b connected to a bonding pad provided on the semiconductor chip 12b. Next, the semiconductor device 200 is obtained by sealing the laminate including the semiconductor chips 12a and 12b (FIG. 18).

Figure 19:
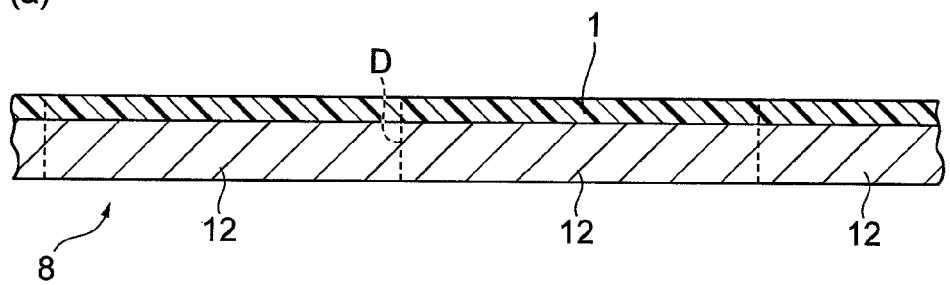
FIG. 19 is an end surface view showing one embodiment of a method for producing a semiconductor device.
Figure 19:
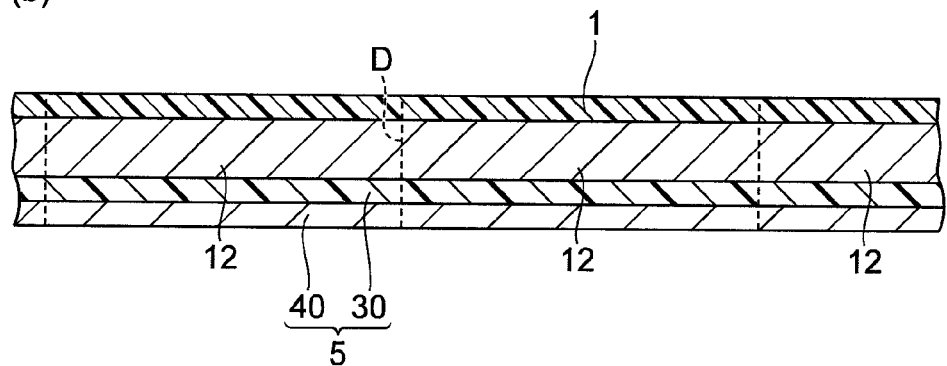
Figure 19:
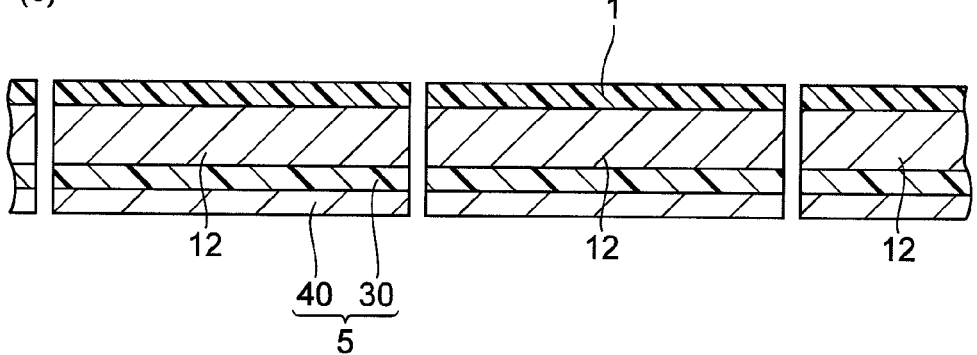

The method for producing a semiconductor device will not be limited to the embodiment above, and various modifications can be made without departing from the gist of the present invention. For example, it is possible to properly change the order of (Step 1) to (Step 7). As shown in FIG. 19, after making the semiconductor wafer 8 on which the adhesive layer 1 has been formed thinner by polishing, dicing may be performed. In this case, after dicing, by patterning the adhesive layer 1 by exposure and development, the same laminate as that in FIG. 16A is obtained. After making the semiconductor wafer thinner by polishing, and dicing, application of the film-like adhesive 1 and the subsequent exposure and development may be performed. Three or more layers of the semiconductor chips 12 may be laminated. In this case, at least one pair of adjacent semiconductor chips is bonded to each other directly by the patterned adhesive layer 1 (the buffer coating film on the lower layer side).

Figure 20:
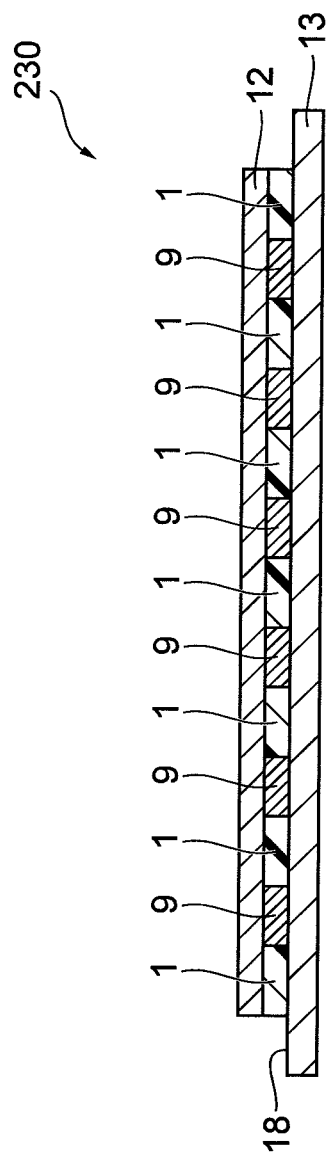
FIG. 20 is an end surface view showing one embodiment of a semiconductor device.

FIG. 20 is an end surface view showing another embodiment of the semiconductor device. A semiconductor device 230 shown in FIG. 20 comprises a support member (first adherent) 13 having a connection terminal (first connection portion: not shown), a semiconductor chip (second adherent) 12 having an electrode portion for connection (second connection portion: not shown), the adhesive layer 1 composed of an insulating material, and a conductive layer 9 composed of a conductive material. The support member 13 has the surface of the circuit 18 opposing to the semiconductor chip 12, and is disposed at a predetermined interval from the semiconductor chip 12. The adhesive layer 1 is formed between the support member 13 and the semiconductor chip 12 in contact therewith; the adhesive layer 1 has a predetermined pattern. The conductive layer 9 is formed between the support member 13 and the semiconductor chip 12 in a portion in which the adhesive layer 1 is not disposed. The electrode portion for connection provided in the semiconductor chip 12 is electrically connected to a connection terminal of the support member 13 via the conductive layer 9.

Hereinafter, using FIG. 21 to FIG. 25, a method for producing the semiconductor device 230 shown in FIG. 20 will be described in details. FIGS. 21, 22, 24, and 25 are an end surface view showing one embodiment of a method for producing a semiconductor device, and FIG. 23 is a sectional view showing one embodiment of a method for producing a semiconductor device. The method for producing a semiconductor device of the present embodiment comprises the following (First Step) to (Forth Step).

Figure 21:
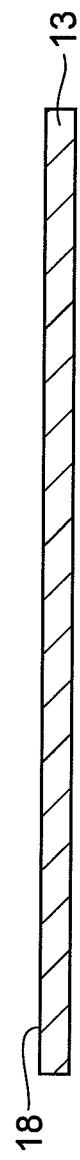
FIG. 21 is an end surface view showing one embodiment of a method for producing a semiconductor device.
Figure 22:
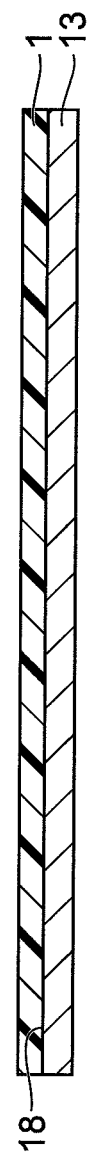
FIG. 22 is an end surface view showing one embodiment of a method for producing a semiconductor device.
Figure 23:
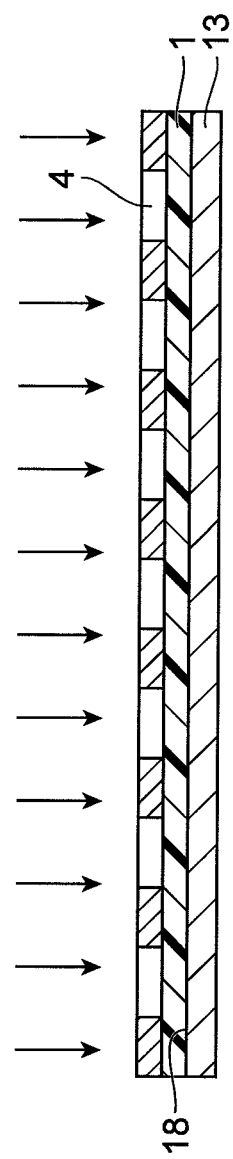
FIG. 23 is a sectional view showing one embodiment of a method for producing a semiconductor device.

(First Step) A step of providing the adhesive layer 1 on the support member 13 having a connection terminal (FIG. 21 and FIG. 22).

Figure 24:
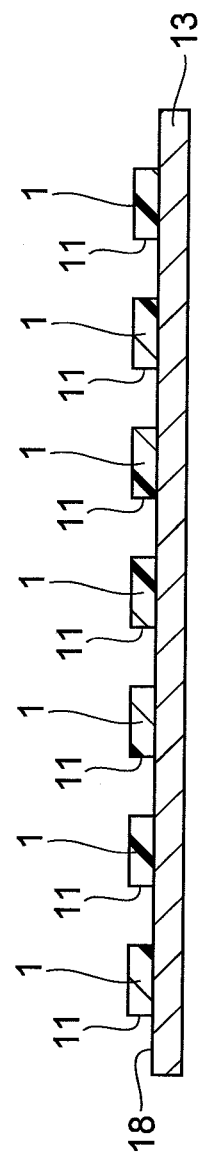
FIG. 24 is an end surface view showing one embodiment of a method for producing a semiconductor device.

(Second Step) A step of patterning the adhesive layer 1 by exposure and development so as to form the opening 11 from which the connection terminal is exposed (FIG. 23 and FIG. 24).

Figure 25:
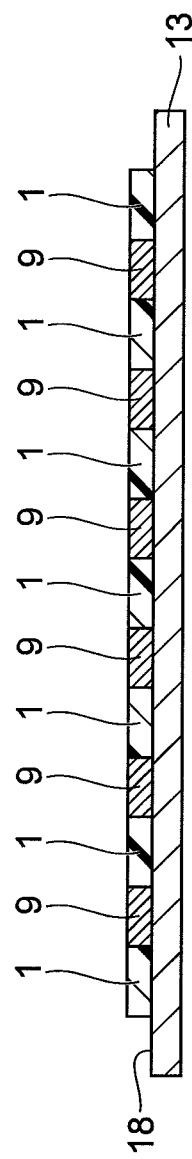
FIG. 25 is an end surface view showing one embodiment of a method for producing a semiconductor device.

(Third Step) A step of filling a conductive material into the opening 11 to form the conductive layer 9 (FIG. 25).

(Forth Step) A step of bonding a semiconductor chip 12 having an electrode portion for connection to a laminate of the support member 13 and the adhesive layer 1 on the adhesive layer 1 side thereof, and electrically connecting a connection terminal of the support member 13 to the electrode portion for connection provided in the semiconductor chip 12 via the conductive layer 9 (FIG. 20).

Hereinafter, (First Step) to (Forth Step) will be described in detail.

(First Step)

One laminates the adhesive layer 1 on the surface of the circuit 18 of the support member 13 shown in FIG. 21 (FIG. 22). As a method for lamination, a method in which one prepares a film-like adhesive molded into a film-like shape in advance, and applies to the support member 13 is simple; one may laminates by a method in which using a spin coating method or the like, one applies a liquid varnish including a photosensitive adhesive composition onto the support member 13, and heats and dries.

The photosensitive adhesive composition according to the present embodiment is a photosensitive adhesive composition that has the adhesion properties to the adherent after the photosensitive adhesive composition is patterned by exposure and development, and enables alkali development. More specifically, the resist pattern formed by patterning the photosensitive adhesive composition by exposure and development has the adhesion properties to the adherent such as the semiconductor chip and the substrate. For example, by press-bonding the adherent to the resist pattern while heating is performed as required, it is possible to bond the resist pattern and the adherent to each other.

(Second Step)

One irradiates the adhesive layer 1 provided on the support member 13 with an active light beam (typically, ultraviolet rays) through the mask 4 in which an opening is formed in a predetermined position (FIG. 23). Thereby, the adhesive layer 1 is exposed in a predetermined pattern.

After exposure, of the adhesive layer 1, by removing the portion not exposed by development using an alkali developer, the adhesive layer 1 is patterned so as to form the opening 11 from which the connection terminal of the support member 13 is exposed (FIG. 24). Instead of a negative photosensitive adhesive composition, it is also possible to use a positive photosensitive adhesive composition; in this case, of the adhesive layer 1, the exposed portion is removed by development.

One fills a conductive material into the opening 11 of the obtained resist pattern to form the conductive layer 9 (FIG. 25). As a filling method of the conductive material, a variety of methods such as gravure printing, indentation by a roll, and decompression filling can be used. Examples of the conductive material used here include an electrode material composed of solder, metals such as gold, silver, nickel, copper, platinum, or palladium, metal oxide such as ruthenium oxide, or a bump of the metals, and those including at least conductive particles and a resin component. As the conductive particles, for example, conductive particles of metals such as gold, silver, nickel, copper, platinum, and palladium, metal oxides such as ruthenium oxide, and organic metal compounds are used. As the resin component, for example, the curable resin composition such as an epoxy resin and the curing agent thereof is used.

The semiconductor chip 12 is directly bonded to the adhesive layer 1 provided on the support member 13. The electrode portion for connection provided in the semiconductor chip 12 is electrically connected to the connection terminal of the support member 13 via the conductive layer 9. A patterned adhesive layer (buffer coating film) may be formed on the surface of the circuit on the semiconductor chip 12 on the side opposite to the adhesive layer 1.

Bonding of the semiconductor chip 12 is performed, for example, by a method in which the adhesive layer 1 (photosensitive adhesive composition) is thermally press-bonded while heating is performed to a temperature at which the adhesive layer 1 demonstrates fluidity. After thermal press-bonding, when necessary, the adhesive layer 1 may be heated to further progress the curing reaction.

It is preferable that one apply a rear surface protective film to the surface of the circuit (rear surface) on the semiconductor chip 12 on the side opposite to the adhesive layer 1.

By the method above, the semiconductor device 230 shown in FIG. 20 is obtained. The method for producing a semiconductor device will not be limited to the embodiment described above, and various modifications can be properly made without departing the gist of the present invention.

For example, the adhesive layer 1 is first provided on the support member 13, but the order is not limited to this; the adhesive layer 1 can be first provided on the semiconductor chip 12. In this case, the method for producing a semiconductor device comprises, for example, a first step of providing the adhesive layer 1 on the semiconductor chip 12 having an electrode portion for connection, a second step of patterning the adhesive layer 1 by exposure and development so as to form the opening 11 from which the electrode portion for connection is exposed, a third step of forming the conductive layer 9 by filling the conductive material into the opening 11, and a fourth step of directly bonding the support member 13 having a connection terminal to the laminate of the semiconductor chip 12 and the adhesive layer 1 on the adhesive layer 1 side and electrically connecting the connection terminal of the support member 13 to the electrode portion for connection provided in the semiconductor chip 12 via the conductive layer 9.

In the production method, connection is the connection of the singulated support member 13 and the singulated semiconductor chip 12; for this reason, connection between the connection terminal on the support member 13 and the electrode portion for connection on the semiconductor chip 12 is easy, and from the viewpoint thereof, the method is preferred.

The adhesive layer 1 can be first provided on the semiconductor wafer constituted of a plurality of the semiconductor chips 12. In this case, the method for producing a semiconductor device comprises, for example, a first step of providing the adhesive layer 1 on the semiconductor wafer constituted of a plurality of the semiconductor chips 12 each having an electrode portion for connection, a second step of patterning the adhesive layer 1 by exposure and development so as to form the opening 11 from which the electrode portion for connection is exposed, a third step of forming the conductive layer 9 by filling the conductive material into the opening 11, a fourth step of directly bonding the support member 13 of a wafer size having the connection terminal (the support member having the approximately same size as that of the semiconductor wafer) to the laminate of the semiconductor wafer and the adhesive layer 1 on the adhesive layer 1 side and electrically connecting the connection terminal of the support member 13 to the electrode portion for connection provided in the semiconductor chip 12, which constitutes the semiconductor wafer, via the conductive layer 9, and a fifth step of cutting (dicing) the laminate of the semiconductor wafer, the adhesive layer 1, and the support member 13 by every semiconductor chip 12.

In the production method, in the first step, one may provide the adhesive layer 1 on the support member 13 of the wafer size; in the fourth step, one may bond the semiconductor wafer directly to the laminate of the support member 13 and the adhesive layer 1 on the adhesive layer 1 side and electrically connects to the connection terminal of the support member 13 to the electrode portion for connection provided in the semiconductor chip 12, which constitutes the semiconductor wafer, via the conductive layer 9; in the fifth step, one may cut the laminate of the semiconductor wafer, the adhesive layer 1, and the support member 13 by every semiconductor chip 12.

In the production method, one can perform the steps up to the connecting step of the semiconductor wafer to the support member 13 (Fourth Step) in a wafer size; for this, the production method is preferred from the viewpoint of working efficiency. It is preferable that one apply a rear surface protective film to the surface of the circuit (rear surface) on the side opposite to the adhesive layer 1 in the semiconductor wafer.

Another method for producing a semiconductor device comprises a first step of providing the adhesive layer 1 on the semiconductor wafer constituted of a plurality of the semiconductor chips 12 having an electrode portion for connection, a second step of patterning the adhesive layer 1 by exposure and development so as to form the opening 11 from which the electrode portion for connection is exposed, a third step of forming the conductive layer 9 by filling the conductive material into the opening 11, a fourth step of cutting (dicing) the laminate of the semiconductor wafer and the adhesive layer 1 by every semiconductor chip 12, and a fifth step of directly bonding the support member 13 having a connection terminal to the singulated laminate of the semiconductor chip 12 and the adhesive layer 1 on the adhesive layer 1 side and electrically connecting the connection terminal of the support member 13 to the electrode portion for connection provided in the semiconductor chip 12 via the conductive layer 9.

In the production method, in the first step, one may provide the adhesive layer 1 on the support member 13 of the wafer size; in the fourth step, one may cut the laminate of the support member 13 of the wafer size and the adhesive layer 1 by every semiconductor chip 12; in the fifth step, one may bond the semiconductor chip directly to the singulated laminate of the support member 13 and the adhesive layer 1 on the adhesive layer 1 side, and may electrically connect the connection terminal of the support member 13 and the electrode portion for connection provided in the semiconductor chip 12 via the conductive layer 9.

In the production method, one can perform the forming step of the adhesive layer 1 to the filling step of the conductive material (the third step) in a wafer size, and one can smoothly perform the dicing step (the fourth step); for this, the production method is preferred.

Using the film-like adhesive, by bonding semiconductor wafers to each other or semiconductor chips to each other, one can constitute a semiconductor device (semiconductor laminate). In the laminate, it is also possible to form a through electrode.

In this case, the method for producing a semiconductor device comprises, for example, a first step of providing the adhesive layer 1 composed of the photosensitive adhesive on a first semiconductor chip 12 having an electrode portion for connection for a through electrode, a second step of patterning the adhesive layer 1 by exposure and development so as to form the opening 11 from which the electrode portion for connection is exposed, a third step of forming the through electrode by filling the conductive material into the opening 11, and a fourth step of directly bonding a second semiconductor chip 12 having an electrode portion for connection to the laminate of the first semiconductor chip 12 and the adhesive layer 1 on the adhesive layer 1 side and electrically connecting the electrode portions for connection provided in the first and second semiconductor chips 12 to each other via the conductive layer 9. In the production method, instead of the semiconductor chip, it is possible to use a semiconductor wafer.

Figure 26:
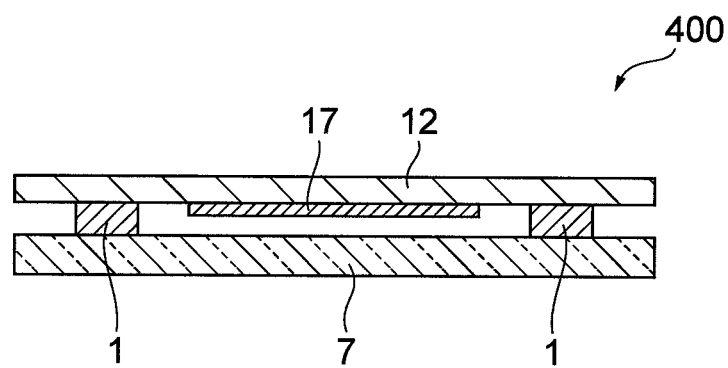
FIG. 26 is an end surface view showing one embodiment of a semiconductor device.

The semiconductor device according to the present embodiment may be a solid-state imaging element 400 shown in FIG. 26. FIG. 26 is an end surface view showing one embodiment of a semiconductor device. The semiconductor device (solid-state imaging element) 400 shown in FIG. 26 comprises a glass substrate 7, a semiconductor chip 12, an adhesive layer 1, and an effective pixel region 17. The glass substrate 7 and the semiconductor chip 12 are bonded to each other via the patterned adhesive layer 1; the effective pixel region 17 is formed on the surface of the semiconductor chip 12 on the glass substrate 7 side.

By forming the adhesive layer 1 from the photosensitive adhesive composition of the present embodiment, it is possible to increase the crosslinking density between molecules in the adhesive layer 1 after heat curing, and to reduce the amount of moisture to invade through the adhesive layer 1. Thereby, it is possible to suppress production of dew condensation on the surface of glass or the like sufficiently.

In the present embodiment, from the viewpoint of obtaining higher airtight sealing properties, it is preferable that the adhesive layer 1 is the one having high adhesion properties to the glass substrate 7. Since the bonding interface of the adhesive layer 1 and the glass substrate 7 is sufficiently bonded, it is possible to suppress peel off of the glass substrate 7 and to further reduce the invasion of moisture from the bonding interface. Thereby, it is possible to further reduce production of dew condensation on the surface of glass or the like.

The semiconductor device (solid-state imaging element) 400 is used for production of a CMOS sensor as shown in FIG. 27, for example. FIG. 27 is an end surface view showing an example of a CMOS sensor in which the semiconductor element shown in FIG. 26 is used as a solid-state imaging element. In a CMOS sensor 300 shown in FIG. 27, the semiconductor device 400 is electrically connected to a connection terminal (not shown) on the semiconductor element-mounting support member 13 via a plurality of conductive bumps 32. Instead of the configuration in which the semiconductor device 400 is bonded using the conductive bumps 32, the CMOS sensor 300 may have a configuration in which the semiconductor device 400 is connected to the connection terminal on the semiconductor element-mounting support member 13 via a conductive wire.

The CMOS sensor 300 has a configuration in which a lens 38 provided so as to be located immediately above the effective pixel region 17 (on the side opposite to the semiconductor chip 12), a side wall 50 provided so as to enclose the semiconductor device 400 with the lens 38, and a fitting member 42 interposed between the lens 38 and the side wall 50 in a state where the lens 38 is fitted are mounted on the semiconductor element-mounting support member 13.

The CMOS sensor 300 is produced as follows: one connects the semiconductor chip 12 in the semiconductor device 400 produced by the method as above to the connection terminal on the semiconductor element-mounting support member 13 via the conductive bump 32, and forms the lens 38, the side wall 50, and the fitting member 42 on the semiconductor element-mounting support member 13 so as to enclose the semiconductor device 400.

The photosensitive adhesive composition according to the present embodiment is not limited to application to the CMOS sensor, and may be used for a package having a hollow structure formed by thermally press-bonding the adherent after pattern formation by exposure and development. Examples of the package having a hollow structure include micro flow passages such as ink jet heads and bio sensors, solar cell members, electronic paper, SAW filters, and those that are disclosed in Japanese Patent Application Laid-Open Publication No. 2005-329532 and require the airtight sealing properties, such as MEMS packages. By using the photosensitive adhesive composition according to the present embodiment for such a package, it is possible to produce a package whose airtight sealing properties are excellent. The photosensitive adhesive composition according to the present embodiment may be used as a rib member having a sealing function when producing the hollow structure.

In the present invention, using the photosensitive adhesive composition according to the present embodiment, a substrate with an adhesive layer can be provided. The substrate with an adhesive layer according to the present embodiment comprises a substrate, and an adhesive layer composed of the film-like adhesive obtained by molding the photosensitive adhesive composition according to the present embodiment and laminated on the substrate into a film-like shape. In the case where the substrate is a transparent substrate, a transparent substrate with an adhesive layer can be obtained. The transparent substrate with an adhesive layer is suitable for production of the solid-state imaging element 400 as shown in FIG. 26. Specifically, one produces a transparent substrate with an adhesive layer in which the adhesive layer according to the present invention is provided on the glass substrate 7 as the transparent substrate, and forms a pattern by exposing and developing the adhesive layer; then, applies the adhesive layer onto the semiconductor chip 12; thereby, the solid-state imaging element 400 can be produced. Examples of substrates other than the transparent substrate include silicon wafers, silicon chips, and resin substrates.

EXAMPLES

Hereinafter, using Examples, the present invention will be more specifically described. However, the present invention will not be limited to Examples below.

<(A) Component: Alkali-soluble Resin>
(PI-1)

In a 300 mL flask comprising a stirrer, a thermometer, a nitrogen purge apparatus (nitrogen introduction pipe), and a reflux cooler with a water container, one placed 14.64 g (0.04 mol) of 2,2-bis(3-amino-4-hydroxyphenyl)hexafluoropropane (made by Central Glass Co., Ltd., trade name: BIS-AP-AF, molecular weight: 366), 17.32 g (0.04 mol) of D-400 (made by BASF SE, trade name: D-400, molecular weight: 433), and 2.485 g (0.01 mol) of BY16-871EG (made by Dow Corning Toray Co., Ltd., trade name: BY16-871EG, molecular weight: 248.5) as diamine, and 80 g of N-methyl-2-pyrrolidone (hereinafter, abbreviated to "NMP") as a solvent, and stirred to dissolve diamine in the solvent.

While cooling the flask in an ice bath, one added 31 g (0.1 mol) of 4,4'-oxydiphthalic dianhydride (hereinafter, abbreviated to "ODPA.") to the solution in the flask little by little. After the completion of the addition, while blowing in nitrogen gas, one raised the temperature of the solution to 180° C. and kept for 5 hours to obtain Polyimide Resin PI-1. When one performed GPC measurement on PI-1, the weight average molecular weight (Mw) was 32000 in terms of polystyrene. The Tg of PI-1 was 75° C.

(PI-2)

In a 300 mL flask comprising a stirrer, a thermometer, a nitrogen purge apparatus (nitrogen introduction pipe), and a reflux cooler with a water container, one placed 21.96 g (0.06 mol) of BIS-AP-AF, 8.66 g (0.02 mol) of D-400, and 2.485 g (0.01 mol) of BY16-871EG as diamine, and 80 g of NMP as the solvent, and stirred to dissolve diamine in the solvent.

While cooling the flask in an ice bath, one added 31 g (0.1 mol) of ODPA to the solution in the flask little by little. After the completion of the addition, while blowing in nitrogen gas, one raised the temperature of the solution to 180° C. and kept for 5 hours to obtain Polyimide Resin PI-2. When one performed GPC measurement on PI -2, the weight average molecular weight (Mw) was 31000 in terms of polystyrene. The Tg of PI-2 was 95° C.

(PI-3)

In a 300 mL flask comprising a stirrer, a thermometer, a nitrogen purge apparatus (nitrogen introduction pipe), and a reflux cooler with a water container, one placed 21.96 g (0.06 mol) of BIS-AP-AF, 8.66 g (0.02 mol) of D-400, and 3.728 g (0.015 mol) of BY16-871EG as diamine, and 80 g of NMP as the solvent, and stirred to dissolve diamine in the solvent.

While cooling the flask in an ice bath, one added 27.9 g (0.09 mol) of ODPA and 5.76 g (0.03 mol) of TAA (trimellitic anhydride) to the solution in the flask little by little. After the completion of the addition, while blowing in nitrogen gas, one raised the temperature of the solution to 180° C. and kept for 5 hours to obtain Polyimide Resin PI-3. When one performed GPC measurement on PI-3, the weight average molecular weight (Mw) was 20000 in terms of polystyrene. The Tg of PI-3 was 90° C.

(PI-4)

In a flask comprising a stirrer, a thermometer, a nitrogen purge apparatus (nitrogen introduction pipe), and a reflux cooler with a water container, one placed 11.4 g (0.04 mol) of 5,5'-methylenebis(anthranilic acid) (made by Wakayama Seika Kogyo Co., Ltd., trade name: MBAA, molecular weight: 286), 17.32 g (0.04 mol) of D-400, and 3.73 g (0.015 mol) of BY16-871EG as diamine, and 90 g of NMP as the solvent, and stirred to dissolve diamine in the solvent.

While cooling the flask in an ice bath, one added 27.9 g (0.09 mol) of ODPA and 5.76 g (0.03 mol) of TA (trimellitic anhydride) to the solution in the flask little by little. After the completion of the addition, while blowing in nitrogen gas, one raised the temperature of the solution to 180° C. and kept for 5 hours to obtain Polyimide Resin PI-4. When one performed GPC measurement on PI-4, the Mw was 20000 in terms of polystyrene. The Tg of PI-4 was 75° C.

(PI-5)

In a flask comprising a stirrer, a thermometer, a nitrogen purge apparatus (nitrogen introduction pipe), and a reflux cooler with a water container, one placed 14.3 g (0.05 mol) of MBAA, 12.99 g (0.03 mol) of D-400, and 3.73 g (0.015 mol) of BY16-871EG as diamine, and 90 g of NMP as the solvent, and stirred to dissolve diamine in the solvent.

While cooling the flask in an ice bath, one added 27.9 g (0.09 mol) of ODPA, and 5.76 g (0.03 mol) of TAA (trimellitic anhydride) to the solution in the flask little by little. After the completion of the addition, while blowing in nitrogen gas, one raised the temperature of the solution to 180° C. and kept for 5 hours to obtain Polyimide Resin PI-5. When one performed GPC measurement on PI -5, the Mw was 21000 in terms of polystyrene. The Tg of PI-5 was 90° C.

(PI-6)

In a flask comprising a stirrer, a thermometer, a nitrogen purge apparatus (nitrogen introduction pipe), and a reflux cooler with a water container, one placed 17.16 g (0.06 mol) of MBAA, 8.66 g (0.02 mol) of D-400, and 3.73 g (0.015 mol) of BY16-871EG as diamine, and 90 g of NMP as the solvent, and stirred to dissolve diamine in the solvent.

While cooling the flask in an ice bath, one added 27.9 g (0.09 mol) of ODPA and 5.76 g (0.03 mol) of TAA (trimellitic anhydride) to the solution in the flask little by little. After the completion of the addition, while blowing in nitrogen gas, one raised the temperature of the solution to 180° C. and kept for 5 hours to obtain Polyimide Resin PI-6. When one performed GPC measurement on PI-6, the Mw was 23000 in terms of polystyrene. The Tg of PI-6 was 105° C.

(PI-7)

In a flask comprising a stirrer, a thermometer, a nitrogen purge apparatus (nitrogen introduction pipe), and a reflux cooler with a water container, one placed 5.72 g (0.02 mol) of MBAA, 25.98 g (0.06 mol) of D-400, and 2.48 g (0.01 mol) of BY16-871EG as diamine, and 110 g of NMP as the solvent, and stirred to dissolve diamine in the solvent.

While cooling the flask in an ice bath, one added 31 g (0.1 mol) of ODPA to the solution in the flask little by little. After the completion of the addition, while blowing in nitrogen gas, one raised the temperature of the solution to 180° C. and kept for 5 hours to obtain Polyimide Resin PI-7. When one performed GPC measurement on PI-7, the Mw was 30000 in terms of polystyrene. The Tg of PI-7 was 45° C.

(PI-8)

In a flask comprising a stirrer, a thermometer, a nitrogen purge apparatus (nitrogen introduction pipe), and a reflux cooler with a water container, one placed 5.72 g (0.02 mol) of MBAA, 12.99 g (0.03 mol) of D-400, 2.48 g (0.0 mol) of BY16-871r EG and 8.17 g (0.04 mol) of 1,4-butanediol bis (3-aminopropyl)ether (made by TOKYO CHEMICAL INDUSTRY CO., LTD., trade name: B-12, molecular weight: 204.31) as diamine, and 110 g of NMP as the solvent were placed, and stirred to dissolve diamine in the solvent.

While cooling the flask in an ice bath, one added 27.9 g (0.09 mol) of ODPA and 3.84 g (0.02 mol) of TAA (trimellitic anhydride) to the solution in the flask little by little. After the completion of the addition, while blowing in nitrogen gas, one raised the temperature of the solution to 180° C. and kept for 5 hours to obtain Polyimide Resin PI-8. When one performed GPC measurement on PI-8, the Mw was 21000 in terms of polystyrene. The Tg of PI-8 was 55° C.

(PI-9)

In a 300 mL flask comprising a stirrer, a thermometer, a nitrogen purge apparatus (nitrogen introduction pipe), and a reflux cooler with a water container, one placed 7.32 g (0.02 mol) of BIS-AP-AF, 12.99 g (0.03 mol) of D-400, 6.12 g (0.03 mol) of B-12, and 2.485 g (0.01 mol) of BY16-871EG as diamine, and 80 g of NMP as the solvent, and stirred to dissolve diamine in the solvent.

While cooling the flask in an ice bath, one added 31 g (0.1 mol) of ODPA to the solution in the flask little by little. After the completion of the addition, while blowing in nitrogen gas, one raised the temperature of the solution to 180° C. and kept for 5 hours to obtain Polyimide Resin PI-9. When one performed GPC measurement on PI-9, the weight average molecular weight (Mw) was 32000 in terms of polystyrene. The Tg of PI-9 was 55° C.

<(E) Component: Compound Having an Ethylenically Unsaturated Group and an Epoxy Group>

(E-1)

In a 500 mL flask comprising a stirrer, a thermometer, and a nitrogen purge apparatus, one placed 178 g (1.0 equivalent) of a liquid high purity bisphenol A bisglycidyl ether epoxy resin (made by Tohto Kasei Co., Ltd., trade name: YD-825GS, epoxy equivalent of 178 g/eq), 36 g (0.5 equivalent) of acrylic acid, 0.5 g of triphenylphosphine, and 0.15 g of hydroquinone while stirring, and reacted at 100° C. for 7 hours to obtain Compound E-1 having a carbon-carbon double bond in the molecule and an epoxy group. One titrated E-1 with an ethanol solution of potassium hydroxide, and found that the acid value was not more than 0.3 KOHmg/g. (5% mass loss temperature: 300° C., the number of the epoxy group: approximately 1, the number of the (meth)acrylic group: approximately 1)

<Preparation of Photosensitive Adhesive Composition>

Using the resin obtained above and other compound, one blended the respective components at the composition ratio (units:parts by mass) shown in Table 1, Table 2, and Table 3 below to obtain photosensitive adhesive compositions (adhesive layer-forming varnishes) in Examples 1 to 11 and Comparative Examples 1 to 5.

In Table 1, Table 2, and Table 3, the respective symbols mean the followings.

M-313: made by TOAGOSEI CO., LTD., isocyanurate EO-modified di- and triacrylate (radiation polymerizable group equivalent: approximately 160 g/eq, 5% mass loss temperature: >400° C.).

YDF-870GS: made by Tohto Kasei Co., Ltd., bisphenol F bisglycidyl ether (epoxy equivalent: 165 g/eq, 5% mass loss temperature: 270° C.).

YD-825GS: made by Tohto Kasei Co., Ltd., bisphenol A bisglycidyl ether (epoxy equivalent of 178 g/eq, 5% mass loss temperature: 270° C.).

TrisP-PA: made by Honshu Chemical Industry Co., Ltd., a trisphenol compound (α,α,α'-tris(4-hydroxyphenol)-1-ethyl-4-isopropylbenzene) (5% mass loss temperature: 350° C.).

R-972: made by Nippon Aerosil Co., Ltd., hydrophobic fumed silica (average particle size: approximately 16 nm)

I-819: made by BASF SE, bis(2,4,6-trimethylbenzoyl)-phenylphosphine oxide (5% mass loss temperature: 210° C., molecular extinction coefficient at 365 nm: 2300 ml/g·cm).

I-OXE02: made by BASF SE, ethanone, 1-[9-ethyl-6-(2-methylbenzoyl)-9H-carbazole-3-yl]-, 1-(O-acetyloxime).

PERCUMYL D: made by NOF CORPORATION, dicumyl peroxide (5% mass loss temperature: 370° C., molecular extinction coefficient at 365 nm: 7700 ml/g·cm).

NMP: made by KANTO CHEMICAL CO., INC., N-methyl-2-pyrrolidone.

One measured the 5% mass loss temperature on the following condition. Namely, using a simultaneous thermogravimetry and differential thermal analyzer (made by SII NanoTechnology Inc., trade name "TG/DTA6300"), one measured the 5% mass loss temperature of a sample at a temperature raising rate of 10° C./min and under nitrogen flow (400 ml/min). The molecular extinction coefficient was determined as follows: one prepared a 0.001% by mass acetonitrile solution of the sample, and measured the absorbance of the solution using a spectrophotometer (made by Hitachi High-Technologies Corporation, "U-3310" (trade name)).

TABLE 1

|  |  | Example 1 | Example 2 | Example 3 | Example 4 | Example 5 | Example 6 |
|---|---|---|---|---|---|---|---|
| Alkali-soluble resin | PI-1 | 100 | 100 | 100 | — | — | — |
|  | PI-2 | — | — | — | 100 | — | — |
|  | PI-3 | — | — | — | — | 100 | — |
|  | PI-4 | — | — | — | — | — | 100 |
|  | PI-5 | — | — | — | — | — | — |
|  | PI-6 | — | — | — | — | — | — |
|  | PI-7 | — | — | — | — | — | — |
|  | PI-8 | — | — | — | — | — | — |
|  | PI-9 | — | — | — | — | — | — |
| Radiation polymerizable compound | M-313 | 80 | 80 | 80 | 80 | 80 | 80 |
| Photoinitiator | I-819 | 2 | 2 | 2 | 2 | 2 | 2 |
|  | I-OXE02 | 1 | 1 | 1 | 1 | 1 | 1 |
| Compound having an ethylenically unsaturated group and an epoxy group | E-1 | 20 | 40 | — | 40 | 40 | — |
| Organic peroxide | PERCUMYL D | 2 | 2 | 2 | 2 | 2 | 2 |
| Thermosetting resin | YDF-870GS | 15 | 30 | — | 30 | 30 | 30 |
|  | YD-825GS | — | — | 30 | — | — | — |
| Curing agent | TrisP-PA | 5 | 10 | 10 | 10 | 10 | 10 |
| Filler | R-972 | 5 | 5 | 5 | 5 | 5 | 5 |
| Tg of alkali-soluble resin (° C.) |  | 75 | 75 | 75 | 95 | 90 | 75 |
| Application properties |  | A | A | A | A | A | A |
| Pattern forming properties |  | A | A | A | A | A | B |
| Lowest melt viscosity (Pa · s) |  | 9000 | 4000 | 13000 | 15000 | 12000 | 16000 |
| Thermal press bondability |  | A | A | A | A | A | A |
| High temperature adhesion properties (MPa) |  | 8.2 | >10 | 2.8 | >10 | >10 | 2.5 |
| Tg after curing (° C.) |  | 100 | 95 | 100 | 120 | 115 | 115 |
| Storage elastic modulus at 110° C. (MPa) |  | 26 | 19 | 28 | 100 | 95 | 32 |
| Reflow resistance |  | A | A | C | A | A | C |
| Airtight sealing properties |  | A | A | A | A | A | A |

TABLE 2

|  |  | Example 7 | Example 8 | Example 9 | Example 10 | Example 11 |
|---|---|---|---|---|---|---|
| Alkali-soluble resin | PI-1 | — | — | — | 50 | 20 |
|  | PI-2 | — | — | — | — | — |
|  | PI-3 | — | — | — | — | — |
|  | PI-4 | 100 | — | — | — | — |
|  | PI-5 | — | 100 | — | — | — |
|  | PI-6 | — | — | 100 | — | — |
|  | PI-7 | — | — | — | — | — |
|  | PI-8 | — | — | — | — | — |
|  | PI-9 | — | — | — | — | — |
| Radiation polymerizable compound | M-313 | 80 | 80 | 80 | 80 | 80 |
| Photoinitiator | I-819 | 2 | 2 | 2 | 2 | 2 |
|  | I-OXE02 | 1 | 1 | 1 | 1 | 1 |
| Compound having an ethylenically unsaturated group and an epoxy group | E-1 | 40 | 40 | 40 | 40 | 40 |
| Organic peroxide | PERCUMYL D | 2 | 2 | 2 | 1 | 1 |
| Thermosetting resin | YDF-870GS | 30 | 30 | 30 | 30 | 30 |
|  | YD-825GS | — | — | — | — | — |
| Curing agent | TrisP-PA | 10 | 10 | 10 | 10 | 20 |
| Filler | R-972 | 5 | 5 | 5 | 15 | 15 |
| Tg of alkali-soluble resin (° C.) |  | 75 | 90 | 105 | 75 | 75 |
| Application properties |  | A | A | A | A | A |
| Pattern forming properties |  | B | B | B | A | A |
| Lowest melt viscosity (Pa · s) |  | 6000 | 8000 | 10000 | 15000 | 22000 |
| Thermal press bondability |  | A | A | A | A | A |
| High temperature adhesion properties (MPa) |  | 8.0 | >10 | >10 | >10 | 5.0 |
| Tg after curing (° C.) |  | 110 | 120 | 125 | 95 | 90 |
| Storage elastic modulus at 110° C. (MPa) |  | 38 | 100 | 260 | 20 | 17 |
| Reflow resistance |  | A | A | A | A | A |
| Airtight sealing properties |  | A | A | A | A | A |

TABLE 3

|  |  | Comp. Ex. 1 | Comp. Ex. 2 | Comp. Ex. 3 | Comp. Ex. 4 | Comp. Ex. 5 |
|---|---|---|---|---|---|---|
| Alkali-soluble resin | PI-1 | — | — | — | — | — |
|  | PI-2 | — | — | — | — | — |
|  | PI-3 | — | — | — | — | — |
|  | PI-4 | — | — | — | — | — |
|  | PI-5 | — | — | — | — | — |
|  | PI-6 | — | — | — | — | — |
|  | PI-7 | 100 | — | — | — | — |
|  | PI-8 | — | 100 | 100 | — | — |
|  | PI-9 | — | — | — | 100 | 100 |
| Radiation polymerizable compound | M-313 | 80 | 80 | 80 | 80 | 80 |
| Photoinitiator | I-819 | 2 | 2 | 2 | 2 | 2 |
|  | I-OXE02 | 1 | 1 | 1 | 1 | 1 |
| Compound having an ethylenically unsaturated group and an epoxy group | E-1 | — | 20 | — | 20 | — |
| Organic peroxide | PERCUMYL D | 2 | 2 | 2 | 2 | 2 |
| Thermosetting resin | YDF-870GS | 15 | 15 | 30 | 15 | 30 |
|  | YD-825GS | — | — | — | — | — |
| Curing agent | TrisP-PA | 10 | 10 | 10 | 10 | 5 |
| Filler | R-972 | 5 | 5 | 5 | 5 | 5 |
| Tg of alkali-soluble resin (° C.) |  | 45 | 55 | 55 | 55 | 55 |
| Application properties |  | A | A | A | A | A |
| Pattern forming properties |  | B | B | C | A | A |
| Lowest melt viscosity (Pa · s) |  | 15000 | <3000 | — | <3000 | 7000 |
| Thermal press bondability |  | A | A | — | A | A |

TABLE 3-continued

|  | Comp. Ex. 1 | Comp. Ex. 2 | Comp. Ex. 3 | Comp. Ex. 4 | Comp. Ex. 5 |
|---|---|---|---|---|---|
| High temperature adhesion properties (MPa) | 0.5 | 3.4 | 0.4 | 2.7 | 0.4 |
| Tg after curing (° C.) | 70 | 75 | 75 | 75 | 75 |
| Storage elastic modulus at 110° C. (MPa) | 9 | 6 | — | 7 | 8 |
| Reflow resistance | C | A | — | A | C |
| Airtight sealing properties | C | C | — | C | C |

<Adhesive Sheet>

One applied each of the obtained photosensitive adhesive compositions onto a base material (release agent-treated PET film) such that the film thickness after drying was 40 μm, heated in an oven at 80° C. for 20 minutes, and subsequently heated at 120° C. for 20 minutes; thus, one formed an adhesive layer composed of the photosensitive adhesive composition on the base material. Thus, an adhesive sheet having the base material and the adhesive layer formed on the base material was obtained.

<Evaluation Test>

The adhesive sheet obtained above was subjected to the following evaluation tests.

(Application Properties)

One placed a silicon wafer (a diameter of 6 inches, a thickness of 400 μm) on a support, and laminated the adhesive sheet on the silicon wafer by roll pressure (a temperature of 100° C., a line pressure of 4 kgf/cm, a feeding rate of 0.5 m/min) such that the adhesive layer contacted the rear surface of the silicon wafer (the surface on the side opposite to the support). After peeling off the base material (PET film), one laminated a polyimide film of 80 μm in thickness, 10 mm in width, and 40 mm in length (made by Ube Industries, Ltd., trade name: UPILEX) on the exposed adhesive layer by applying roll pressure on the same condition as that above. Thus, a sample of a laminate composed of the silicon wafer, the adhesive layer, and the polyimide film was obtained in which the silicon wafer, the adhesive layer, and the polyimide film were laminated in this order.

Using a rheometer (made by Toyo Seiki Seisaku-sho, Ltd., trade name: Strograph E-S), the obtained sample was subjected to a 90° peel test at room temperature, and one measured peel strength of the adhesive layer and the polyimide film. Based on the measurement result, one performed evaluation of the application properties wherein a sample whose peel strength was not less than 2 N/cm was A, and a sample whose peel strength was less than 2 N/cm was B. The evaluation results are shown in Table 1, Table 2, and Table 3.

(High Temperature Adhesion Properties)

One laminated the adhesive sheet on the silicon wafer in the same manner as in the evaluation test on the application properties except that the temperature in roll pressure was 80° C. One exposed the obtained laminate at 1000 mJ/cm² from the adhesive sheet side using a high precision parallel exposure machine (made by ORC MANUFACTURING CO., LTD., trade name: EXM-1172-B-∞), and heated on a hot plate at 80° C. for 30 seconds. After peeling off the base material (PET film), using a conveyor developing machine (made by YAKO Co., Ltd.), one used a tetramethylammonium hydride (TMAH) 2.38% by mass solution as a developer to perform spray development under the conditions of a temperature of 26° C. and a spray pressure of 0.18 MPa; then, one washed the obtained product by pure water at a temperature of 25° C. under the conditions of a spray pressure of 0.02 MPa for 6 minutes, and dried at 120° C. for 1 minute. Thus, one formed a cured product layer composed of a cured product of the photosensitive adhesive composition on the silicon wafer.

One singulated the obtained laminate composed of the silicon wafer and the cured product layer into a size of 3 mm×3 mm. After drying the singulated laminate on a hot plate at 120° C. for 10 minutes, one laminated the laminate on a glass substrate (10 mm×10 mm×0.55 mm) such that the cured product layer contacted the glass substrate, and press-bonded at 150° C. for 10 seconds while pressure was applied at 2 kgf. Thus, a sample of a laminate composed of the silicon wafer, the cured product layer, and the glass substrate was obtained in which the silicon wafer, the cured product layer, and the glass substrate were laminated in this order.

One heated the obtained sample in an oven under the conditions of 180° C. and 3 hours, and further heated on a heating plate at 260° C. for 10 seconds; then, one measured the adhesive force using a Shear Bond tester (made by Dage Holdings Limited, trade name: Dage-4000). The measurement results are shown in Table 1, Table 2, and Table 3.

(Pattern Forming Properties)

One laminated the adhesive sheet on the silicon wafer in the same manner as in the evaluation test on the high temperature adhesion properties except that the temperature in roll pressure was 80° C. One exposed the obtained laminate from the adhesive sheet side through a mask for negative patterning (made by Hitachi Chemical Company, Ltd., trade name: No. G-2) in the same manner as in the test. Next, in the same manner as in the test, after leaving the laminate on a hot plate, one removed the base material, and performed development, washing with water, and drying. Thus, one formed adhesive pattern of the photosensitive adhesive composition on the silicon wafer.

One observed visually the formed adhesive pattern; one performed evaluation of the pattern forming properties wherein the case where a thin line pattern at line width/space width=50 μm/50 μm or less was formed was A, the case where the thin line pattern at line width/space width=60 μm/60 m to 400 μm/400 μm was formed was B, and the case where no pattern was formed was C. The evaluation results are shown in Table 1, Table 2, and Table 3.

(Measurement of Lowest Melt Viscosity)

One laminated each of the adhesive sheets obtained in Examples 1 to 11 and Comparative Examples 1 to 5 on a Teflon (R) sheet by applying pressure with a roll (a temperature of 60° C., a line pressure of 4 kgf/cm, a feeding rate of 0.5 m/min), with the adhesive layer facing the Teflon (R) sheet side. Subsequently, using a high precision parallel exposure machine (made by ORC MANUFACTURING CO., LTD., trade name: EXM-1172), one exposed the adhesive sheet at 1000 mJ/cm², and heated on a hot plate at 80° C. for 30 seconds. Using a conveyor developing machine (made by YAKO Co., Ltd.), one used a tetramethylammonium hydride (TMAH) 2.38% by mass solution as a developer to spray develop the obtained sheet under the conditions of a temperature of 26° C. and a spray pressure of 0.18 MPa; then, one washed the sheet by pure water at a temperature of 25° C. under the conditions of a spray pressure of 0.02 MPa for 3 minutes. One removed the base material (PET film), laminated at 80° C. such that the thickness was approximately 200 μm, and cut the obtained product into a size of 10 mm×10 mm. One removed the Teflon (R) sheet on the one side of the obtained sample, and heated the sample at 120° C. for 10 minutes; then, one measured using a viscoelasticity measurement apparatus (made by Rheometric Scientific Inc., trade name: ARES). The measurement plate was a parallel plate of 8 mm in diameter, and the measurement condition was set at a temperature raising rate of 5° C./min and a frequency of 1 Hz. The lowest value of the melt viscosity at 20° C. to 200° C. was the lowest melt viscosity. The results are shown in Table 1, Table 2, and Table 3.

(Thermal Press Bondability)

One formed an adhesive pattern of the photosensitive adhesive composition on the silicon wafer in the same manner as in the evaluation test on the pattern forming properties except that the temperature in roll pressure was 60° C., and a frame-like mask pattern of a 6-inch size (a hollow portion of 2 mm, a line width of 0.5 mm) was used instead of the mask for negative patterning.

After drying on a hot plate at 120° C. for 10 minutes, one laminated a glass substrate (15 mm×40 mm×0.55 mm) on the surface of the adhesive pattern on the side opposite to the silicon wafer; while applying pressure at 0.5 MPa, one press-bonded at 150° C. for 10 minutes, and obtained a sample of a laminate composed of the silicon wafer, the adhesive pattern, and the glass substrate, in which the silicon wafer, the adhesive pattern, and the glass substrate were laminated in this order.

One observed the sample, and performed evaluation of the thermal press bondability wherein those in which a non-bonded portion (gap) was not more than 20% based on the bonding area of the glass substrate and the adhesive pattern was A, and those in which a non-bonded portion (gap) exceeded 20% was C. The evaluation results are shown in Table 1, Table 2, and Table 3.

(Reflow Resistance)

A sample of a laminate composed of the silicon wafer, the adhesive pattern, and the glass substrate in which the silicon wafer, the adhesive pattern, and the glass substrate were laminated in this order was obtained in the same manner as in the evaluation test on the thermal press bondability. One heated the obtained sample in an oven under the conditions of 180° C. and 3 hours. After treating the sample after heating under the condition of a temperature of 85° C. and a humidity of 60% for 168 hours, and leaving the sample under an environment of a temperature of 25° C. and a humidity of 50%; then, one performed IR reflow at 250° C. for 10 seconds, and observed presence of peeling by a microscope (magnification: 15 times). One performed evaluation of the reflow resistance wherein of a portion in which glass of 15 mm×40 mm×0.55 mm was press-bonded, those in which peeling of 1 IC (a frame of a 2 mm square and a line width of 0.5 mm) or more was not found were A, and those in which peeling was found were C. The evaluation results are shown in Table 1, Table 2, and Table 3.

(Airtight Sealing Properties)

One heated a sample of the laminate in an oven at 180° C. for 3 hours in the same manner as in the evaluation test on the reflow resistance. After treating the sample after heating under the condition of a temperature of 110° C. and a humidity of 85% for 48 hours, and leaving the sample under an environment of a temperature of 25° C. and a humidity of 50%; then, one observed with a microscope (magnification: 15 times) whether dew condensation occurred in the hollow portion within the glass of the sample. One performed evaluation of the airtight sealing properties wherein the case in which dew condensation was found was C, and the case other than the case above was A. The evaluation results are shown in Table 1, Table 2, and Table 3.

(Storage Elastic Modulus at 110° C.)

One placed a Teflon (R) sheet on a support, and laminated the adhesive sheet on the Teflon sheet by roll pressure (a temperature of 60° C., a line pressure of 4 kgf/cm, a feeding rate of 0.5 m/min). One exposed the obtained laminate at 1000 mJ/cm$^2$ from the side of the adhesive sheet with a base material by a high precision parallel exposure machine (made by ORC MANUFACTURING CO., LTD., trade name: EXM-1172-B-∞), and heated on a hot plate at 80° C. for 30 seconds. After peeling off the base material (PET film), using a conveyor developing machine (made by YAKO Co., Ltd.), one used a tetramethylammonium hydride (TMAH) 2.38% by mass solution as a developer, and exposed the laminate under the conditions of a temperature of 26° C. and a spray pressure of 0.18 MPa for 1 minute; then, one washed the laminate by pure water at a temperature of 25° C. under the conditions of a spray pressure of 0.02 MPa for 6 minutes. After drying the obtained film on a hot plate at 120° C. for 10 minutes, one laminated by roll pressure (a temperature of 100° C., a line pressure of 4 kgf/cm, a feeding rate of 0.5 m/min) such that the thickness was 80 μm, and obtained a sample of a laminate composed of the Teflon (R) sheet, the adhesive layer, and the Teflon (R) sheet. After peeling off the Teflon (R) sheet on the one side, one heated the sample in an oven under the conditions of 180° C. and 3 hours. One cut the sample after heating into a strip of 5 mm in width; using a viscoelasticity analyzer (made by Rheometric Scientific Inc., trade name: RSA-2), one measured the sample under the conditions of a temperature raising rate of 5° C./min, a frequency of 1 Hz, a measurement temperature of −50° C. to 300° C., and obtained a storage elastic modulus at 110° C. The evaluation results are shown in Table 1, Table 2, and Table 3.

(Tg after Curing)

One produced a sample after curing and measured by the same method as that in the "storage elastic modulus at 110° C."; the tan δ peak temperature at this time was Tg. The evaluation results are shown in Table 1, Table 2, and Table 3.

The photosensitive adhesive composition of the present invention can form an adhesive pattern having sufficient airtight sealing properties; for this reason, the photosensitive adhesive composition of the present invention is suitably used as an adhesive used in a highly precise semiconductor package. The film-like adhesive and adhesive sheet of the present invention are excellent in alignment precision when applying onto the adherent or support member such as substrates, glass, and silicon wafers than in the case where a liquid resin composition is used; in addition, it is possible to improve resolution of patterning by exposure; further, the film-like adhesive and adhesive sheet of the present invention have low temperature thermal press bondability to the adherent such as the substrates, glass, and semiconductor elements after pattern formation, and high heat resistance after heat curing; for this reason, the film-like adhesive and adhesive sheet of the present invention can be suitably used in application of protection of semiconductor elements, optical elements, and solid-state imaging elements, and application of adhesives used in the case where a fine bonding region is required, and application of buffer coating.

DESCRIPTION OF SYMBOLS

1 . . . film-like adhesive (adhesive layer), 1a . . . adhesive pattern, 2 . . . cover film, 3 . . . base material, 4 . . . mask, 5 . . . composite film, 6 . . . tackifier layer, 7 . . . glass substrate, 8 . . . semiconductor wafer, 9 . . . conductive layer, 11 . . . opening, 12, 12a, 12b . . . semiconductor element (semiconductor chip), 13 . . . semiconductor element-mounting support member (support member), 14, 14a, 14b . . . wire, 15 . . . sealing material, 16 . . . terminal, 17 . . . effective pixel region, 18 . . . surface of circuit, 20 . . . semiconductor wafer with adhesive layer, 30 . . . die bonding material, 32 . . . conductive bump, 38 . . . lens, 40 . . . dicing tape, 42 . . . fitting member, 50 . . . side wall, 100, 110, 120 . . . adhesive sheet, 200, 210, 220, 230 . . . semiconductor device, 300 . . . CMOS sensor, 400 . . . semiconductor device (solid-state imaging element), D . . . dicing line

What is claimed is:

1. A photosensitive adhesive composition that has thermal press bondability to an adherent after being patterned by exposure and development and enables alkali development, wherein
the composition comprises an (A) alkali-soluble polyimide resin obtained by reacting a tetracarboxylic acid dianhydride with a diamine containing 10 mol % to 80 mol % of a phenolic hydroxyl group-containing diamine represented by formula (A-1) based on the diamines in total and an aliphatic ether diamine represented by formula (8):

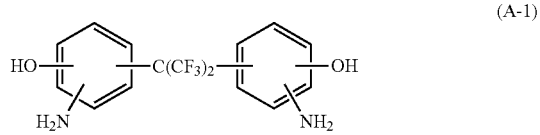

(A-1)

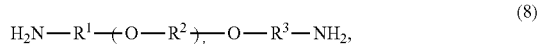

(8)

wherein $R^1$, $R^2$ and $R^3$ are independently alkylene groups having 1 to 10 carbons atoms,
wherein in the above formulae b is an integer between 2 and 80, and
a storage elastic modulus at 110° C. after exposure and further heat curing is not less than 10 MPa.

2. The photosensitive adhesive composition according to claim 1, wherein a Tg after exposure and further heat curing is not less than 80° C.

3. The photosensitive adhesive composition according to claim 1, wherein a lowest melt viscosity at 20° C. to 200° C. after exposure is not more than 30000 Pa·s.

4. The photosensitive adhesive composition according to claim 1, comprising a (B) radiation polymerizable compound, and a (C) photoinitiator.

5. The photosensitive adhesive composition according to claim 1, wherein a Tg of the (A) alkali-soluble resin is 40° C. to 150° C.

6. The photosensitive adhesive composition according to claim 4, wherein the (A) alkali-soluble resin is a polyimide resin having a carboxyl group and/or a hydroxyl group.

7. The photosensitive adhesive composition according to claim 1, wherein the (B) radiation polymerizable compound contains at least one (meth)acrylate having a functionality of 3 or more.

8. The photosensitive adhesive composition according to claim 4, further comprising a (D) epoxy resin.

9. The photosensitive adhesive composition according to claim 8, wherein the (D) epoxy resin contains at least one of a bisphenol F epoxy resin and a bisphenol A epoxy resin.

10. The photosensitive adhesive composition according to claim 4, further comprising an (E) compound having an ethylenically unsaturated group and an epoxy group.

11. The photosensitive adhesive composition according to claim 4, further comprising an (F) filler.

12. A film-like adhesive obtained by molding the photosensitive adhesive composition according to claim 1 into a film-like shape.

13. An adhesive sheet comprising a base material, and an adhesive layer formed on the base material and composed of the film-like adhesive according to claim 12.

14. An adhesive pattern obtained by exposing an adhesive layer laminated on an adherent and composed of the film-like adhesive according to claim 12, and performing a developing treatment on the adhesive layer after exposure with an alkali developer.

15. A semiconductor wafer with an adhesive layer comprising:
a semiconductor wafer; and
an adhesive layer laminated on the semiconductor wafer and composed of the film-like adhesive according to claim 12.

16. A transparent substrate with an adhesive layer comprising:
a transparent substrate; and
an adhesive layer laminated on the transparent substrate and composed of the film-like adhesive according to claim 12.

17. A semiconductor device having a structure in which using the photosensitive adhesive composition according to claim 1, semiconductor elements are bonded to each other, and/or a structure in which using the photosensitive adhesive composition according to claim 1, a semiconductor element and a semiconductor element-mounting support member are bonded to each other.

18. The semiconductor device according to claim 17, wherein the semiconductor element-mounting support member is a transparent substrate.

19. The photosensitive adhesive composition according to claim 1, wherein a Tg of the (A) alkali-soluble resin is at least 60° C.

20. The photosensitive adhesive composition according to claim 1, further comprising a (B) radiation polymerizable compound containing at least one (meth)acrylate having a functionality of at least 2.

21. The photosensitive adhesive composition according to claim 1, further comprising:
a (B) radiation polymerizable compound;
a (C) photoinitiator;
an (D) epoxy resin;
a curing agent; and
a (F) filler.

22. The photosensitive adhesive composition according to claim 1, wherein the content of the diamine represented by formula (A-1) is 30 mol % to 70 mol % in total.

23. The photosensitive adhesive composition according to claim 1, wherein the photosensitive adhesive composition has a property of airtight sealing.

24. The photosensitive adhesive composition according to claim 1, wherein the photosensitive adhesive composition is configured to form an adhesive pattern on a transparent substrate of a solid-state imaging element.

* * * * *